United States Patent
Lu et al.

(10) Patent No.: US 11,798,941 B2
(45) Date of Patent: Oct. 24, 2023

(54) SEMICONDUCTOR DEVICE HAVING AN UPPER EPITAXIAL LAYER CONTACTING TWO LOWER EPITAXIAL LAYERS

(71) Applicant: TAIWAN SEMICONDUCTOR MANUFACTURING CO., LTD., Hsinchu (TW)

(72) Inventors: Wei-Yuan Lu, Taipei (TW); Sai-Hooi Yeong, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 313 days.

(21) Appl. No.: 17/099,636

(22) Filed: Nov. 16, 2020

(65) Prior Publication Data

US 2021/0091078 A1 Mar. 25, 2021

Related U.S. Application Data

(62) Division of application No. 16/200,702, filed on Nov. 27, 2018, now Pat. No. 10,840,243, which is a
(Continued)

(51) Int. Cl.
*H01L 29/78* (2006.01)
*H01L 27/088* (2006.01)
(Continued)

(52) U.S. Cl.
CPC .... *H01L 27/0886* (2013.01); *H01L 21/28525* (2013.01); *H01L 21/76897* (2013.01); *H01L 21/823431* (2013.01); *H01L 21/823475* (2013.01); *H01L 21/823481* (2013.01); *H01L 29/0847* (2013.01); *H01L 29/165* (2013.01);
(Continued)

(58) Field of Classification Search
None
See application file for complete search history.

(56) References Cited

U.S. PATENT DOCUMENTS 7,719,062 B2 5/2010 Fischer et al.
8,772,109 B2 7/2014 Colinge
(Continued)

OTHER PUBLICATIONS

Notice of Allowance issued in related U.S. Appl. No. 15/696,573, dated Apr. 30, 2019.
(Continued)

*Primary Examiner* — Bilkis Jahan
(74) *Attorney, Agent, or Firm* — McDermott Will & Emery LLP

(57) ABSTRACT

In in a method of manufacturing a semiconductor device, an interlayer dielectric (ILD) layer is formed over an underlying structure. The underlying structure includes a gate structure disposed over a channel region of a fin structure, and a first source/drain epitaxial layer disposed at a source/drain region of the fin structure. A first opening is formed over the first source/drain epitaxial layer by etching a part of the ILD layer and an upper portion of the first source/drain epitaxial layer. A second source/drain epitaxial layer is formed over the etched first source/drain epitaxial layer. A conductive material is formed over the second source/drain epitaxial layer.

20 Claims, 21 Drawing Sheets

Related U.S. Application Data division of application No. 15/696,573, filed on Sep. 6, 2017, now Pat. No. 10,325,911.

(60) Provisional application No. 62/440,778, filed on Dec. 30, 2016.

(51) Int. Cl.

| | |
|---|---|
| *H01L 29/417* | (2006.01) |
| *H01L 29/66* | (2006.01) |
| *H01L 21/8234* | (2006.01) |
| *H01L 29/08* | (2006.01) |
| *H01L 29/165* | (2006.01) |
| *H01L 21/768* | (2006.01) |
| *H01L 21/285* | (2006.01) |
| *H01L 29/49* | (2006.01) |

(52) U.S. Cl.
CPC .. *H01L 29/41791* (2013.01); *H01L 29/66545* (2013.01); *H01L 29/66795* (2013.01); *H01L 21/28518* (2013.01); *H01L 21/76831* (2013.01); *H01L 21/823425* (2013.01); *H01L 29/495* (2013.01); *H01L 29/4958* (2013.01); *H01L 29/4966* (2013.01); *H01L 29/4975* (2013.01); *H01L 29/665* (2013.01); *H01L 29/7853* (2013.01)

(56) References Cited

U.S. PATENT DOCUMENTS

| | | | |
|---|---|---|---|
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,324,610 | B2 * | 4/2016 | Hung ............... H01L 29/41791 |
| 9,466,678 | B2 * | 10/2016 | Huang ............... H01L 21/302 |
| 9,520,482 | B1 | 12/2016 | Chang et al. |
| 9,576,814 | B2 | 2/2017 | Wu et al. |
| 9,634,141 | B1 | 4/2017 | Wang et al. |
| 9,899,522 | B1 | 2/2018 | Liu et al. |
| 2008/0157224 | A1 | 7/2008 | Fischer et al. |
| 2012/0001263 | A1 | 1/2012 | Richter et al. |
| 2015/0295089 | A1 * | 10/2015 | Huang ............ H01L 21/31116 438/283 |
| 2016/0020208 | A1 * | 1/2016 | Anderson ........ H01L 21/28518 438/283 |
| 2016/0020209 | A1 * | 1/2016 | Anderson ............ H01L 21/845 438/283 |
| 2016/0027918 | A1 * | 1/2016 | Kim .................. H01L 29/7848 257/401 |
| 2016/0141295 | A1 | 5/2016 | Wu et al. |
| 2016/0163850 | A1 * | 6/2016 | Liu .................. H01L 29/41758 257/338 |

OTHER PUBLICATIONS

Non-Final Office Action issued in U.S. Appl. No. 16/200,702, filed Mar. 26, 2020.

Notice of Allowance issued in U.S. Appl. No. 16/200,702, filed Jul. 14, 2020.

Non-Final Office Action issued in U.S. Appl. No. 16/200,702, dated Mar. 26, 2020.

Notice of Allowance issued in U.S. Appl. No. 16/200,702, dated Jul. 14, 2020.

* cited by examiner

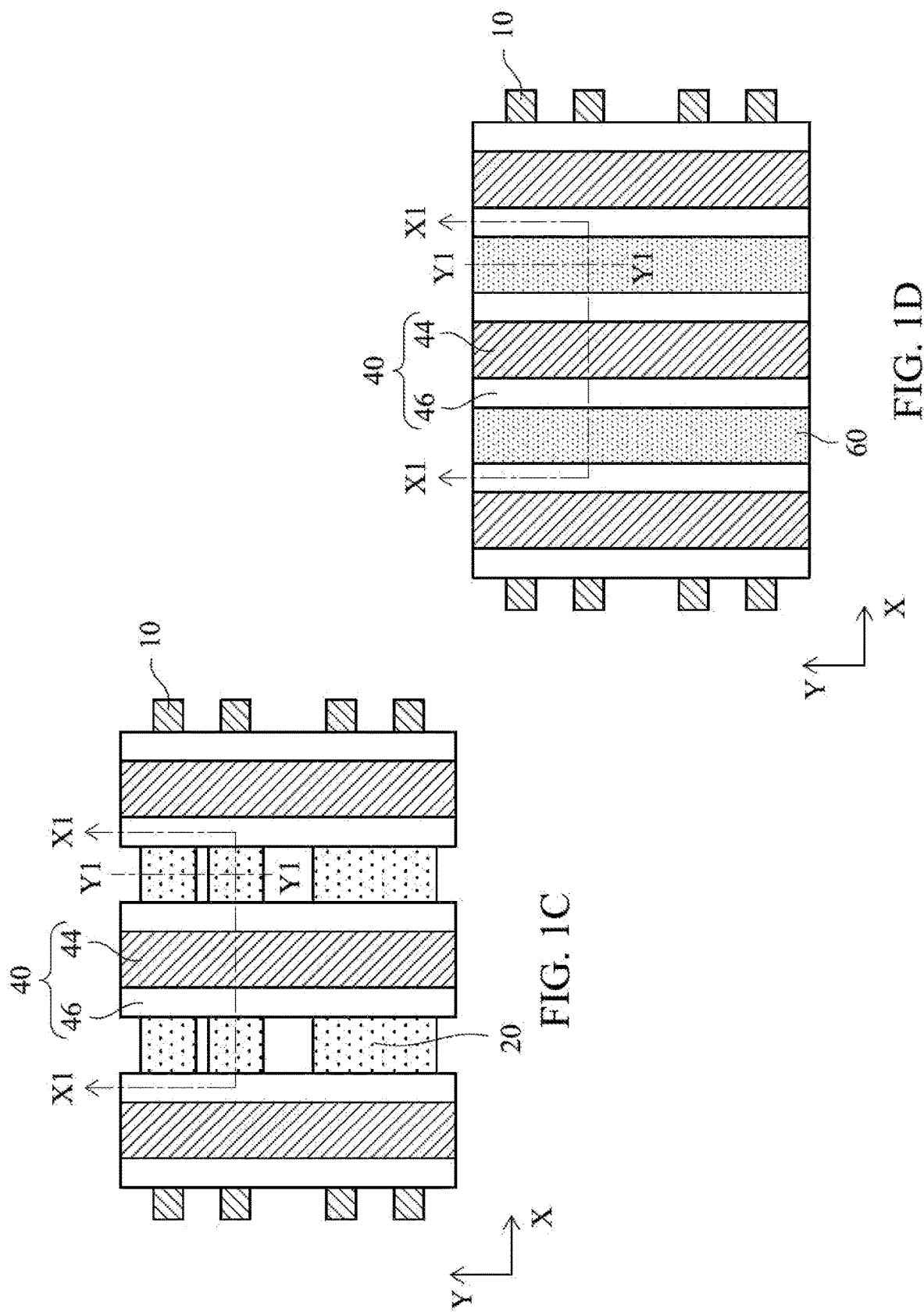

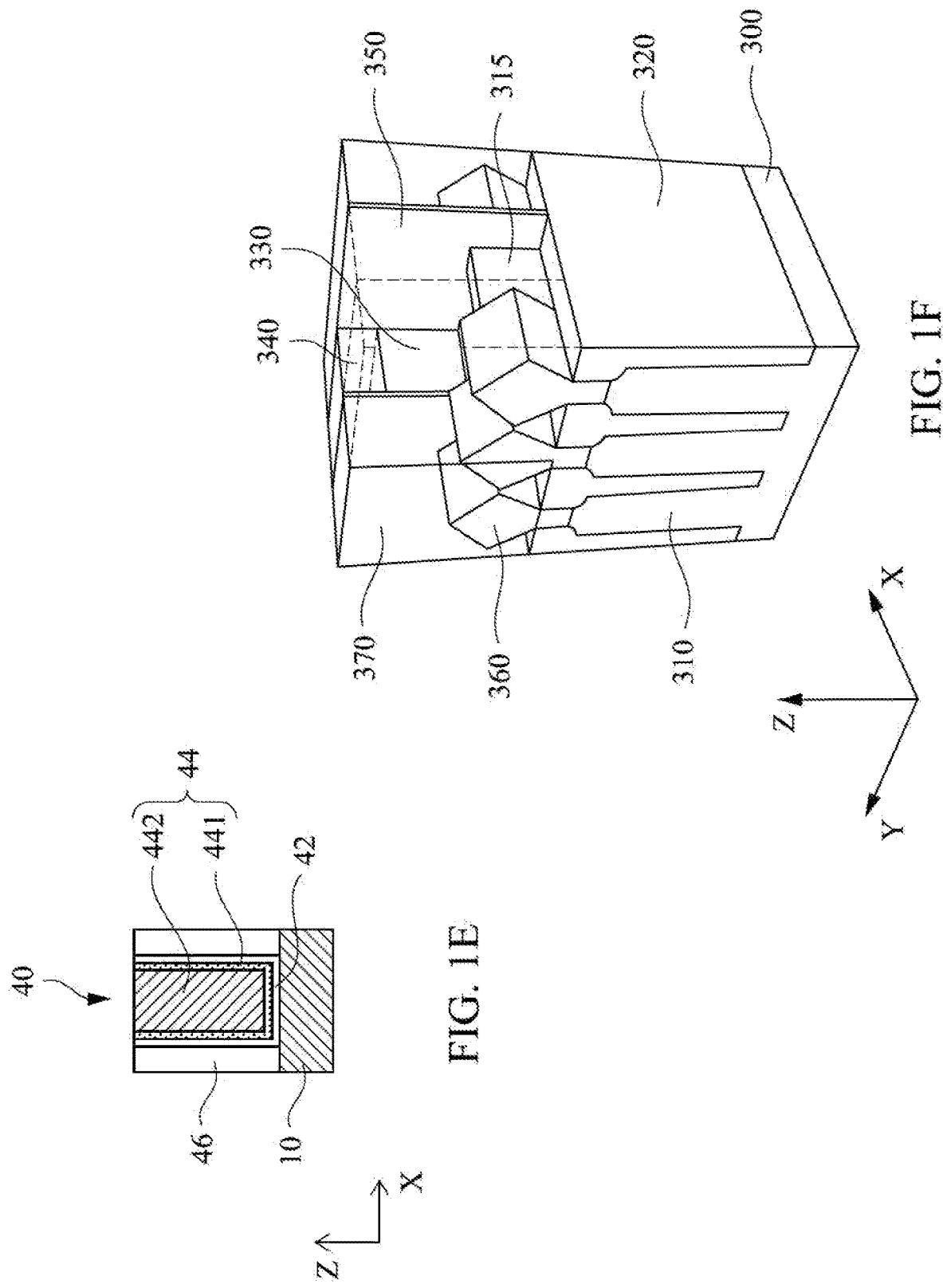

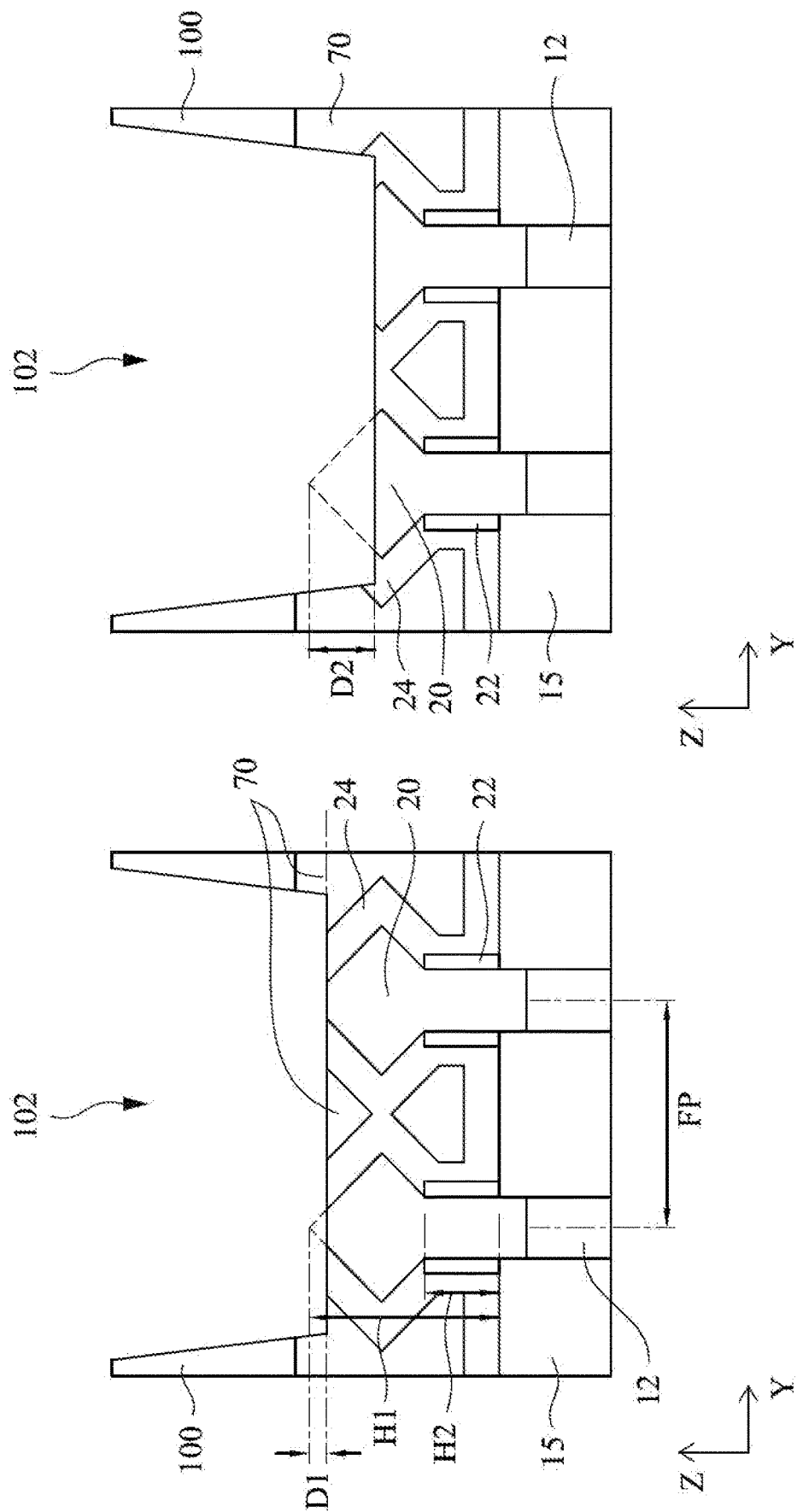

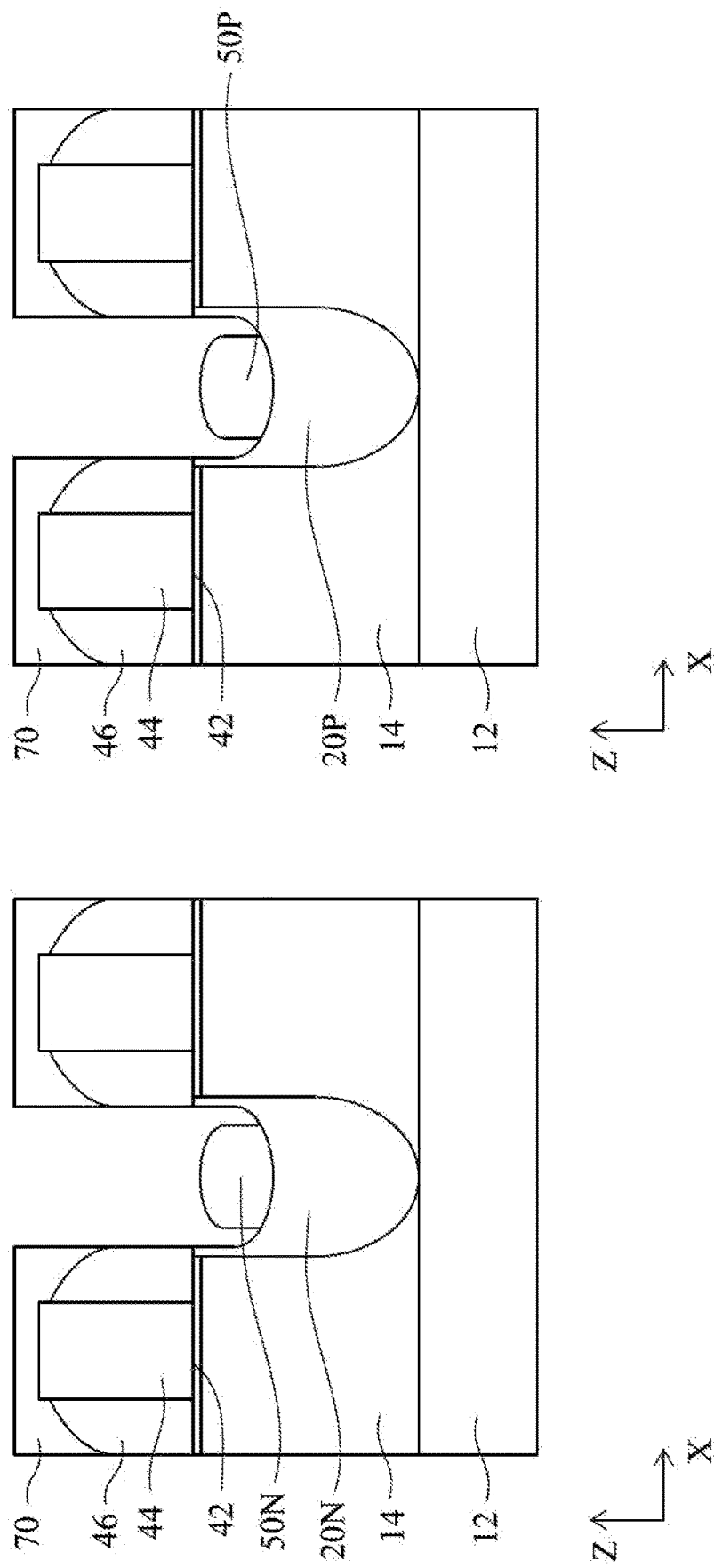

SEMICONDUCTOR DEVICE HAVING AN UPPER EPITAXIAL LAYER CONTACTING TWO LOWER EPITAXIAL LAYERS

CROSS-REFERENCE TO RELATED APPLICATIONS

This application is a divisional application of application Ser. No. 16/200,702 filed on Nov. 27, 2018, now U.S. Pat. No. 10,840,243, which is a divisional application of application Ser. No. 15/696,573 filed on Sep. 6, 2017, now U.S. Pat. No. 10,325,911, which claims the benefit of priority to U.S. Provisional Patent Application 62/440,778 filed Dec. 30, 2016, the entire disclosures of each of which are incorporated herein by reference.

TECHNICAL FIELD

The disclosure relates to a method for manufacturing a semiconductor device, and more particularly to a structure and a manufacturing method for a semiconductor device having reduced source/drain (S/D) contact resistance.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET) including a fin FET (Fin-FET). In a FinFET, a gate electrode is adjacent to three side surfaces of a channel region with a gate dielectric layer interposed therebetween. As the size of the FinFET shrinks, the electrode contact area on the S/D shrinks, thereby increasing the contact resistance. As transistor dimensions are continually scaled down, further improvements of the FinFET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1C is a plan view of the semiconductor device, and FIG. 1D is another plan view of the semiconductor device, according to embodiments of the present disclosure. FIG. 1E is a cross sectional view of a gate structure of the semiconductor device and FIG. 1F is a perspective view of the semiconductor device, according to embodiments of the present disclosure.

FIGS. 4A, 4B and 4C each show one of the various stages of a sequential manufacturing operation for a semiconductor device according to embodiments of the present disclosure.

FIGS. 15A and 15B show one of the various stages of a sequential manufacturing operation for a semiconductor device according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Because the gate-to-gate space (<10 nm) is becoming smaller and smaller, contact resistance between source/drain contacts and source/drain (S/D) epitaxial layers becomes an issue beyond the 5-nm node. Generally, the S/D epitaxial layer is formed before a metal gate structure including a high-k dielectric layer is formed, an interlayer dielectric (ILD) layer is formed over the S/D epitaxial layer and the metal gate structure, a contact opening is formed over the S/D epitaxial layer, and then the source/drain contact is formed on the S/D epitaxial layer. In such a process, a portion of the S/D epitaxial layer may be lost or etched during subsequent etching to form the contact opening, resulting in a tight process window and a higher contact resistance. In addition, if an increase in volume of the S/D epitaxial layer is attempted in view of the subsequent loss, a tight fin pitch may prevent the volume increase.

According to embodiments of the present disclosure, an additional epitaxial layer is formed after the contact opening is formed to enlarge the contact landing area and to reduce contact resistance, and thus further forming a large volume S/D epitaxial layer is not necessary.

Figures 1A, 1B:
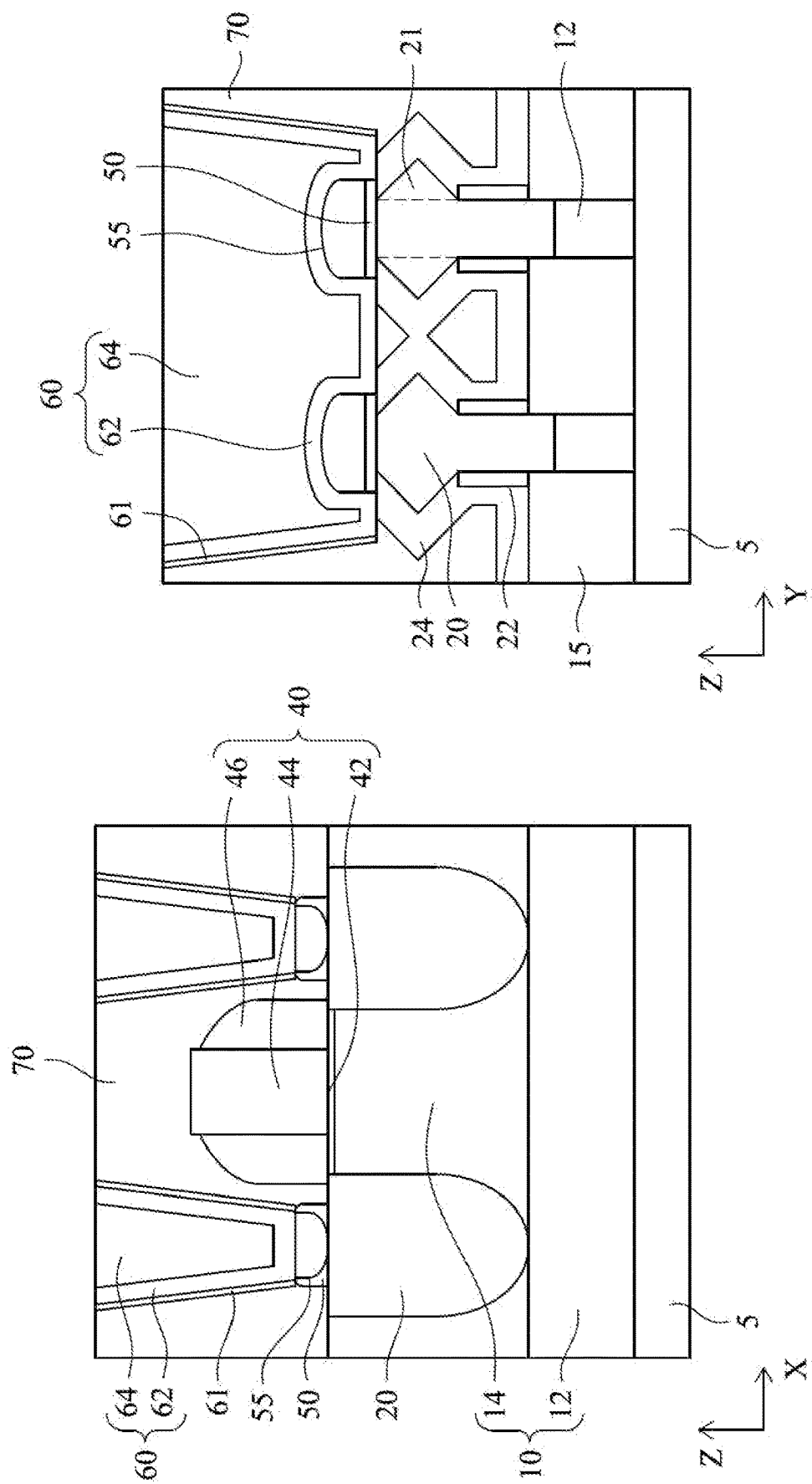
FIG. 1A shows a cross sectional view of a semiconductor device.
FIG. 1B is another cross sectional view of the semiconductor device.

FIG. 1A shows a cross sectional view in the X direction of a semiconductor device corresponding to line X1-X1 of FIGS. 1C and 1D, and FIG. 1B is a cross sectional view along the Y direction corresponding to line Y1-Y1 of FIGS. 1C and 1D. FIG. 1C is a plan view of the semiconductor device showing a source/drain (S/D) epitaxial layer, and FIG. 1D is a plan view of the semiconductor device showing an S/D contact layer.

In the present embodiments, a fin field effect transistor (FinFET) fabricated by a gate replacement technology is employed. However, the following manufacturing operations can be applied to other FET, such as a gate-all-around FET or a planar-type FET, or a gate-first technology.

As shown in FIGS. 1A and 1B, fin structures 10 are disposed over a substrate 5. The fin structure 10 includes a channel region 14 and well region 12. In the well region 12, anti-punch-through (APT) implantation is performed, and thus the well region 12 has different dopant concentration/characteristics than the channel region 14. The fin structures 10 made of, for example Si, are disposed and extend in the X direction as shown in FIGS. 1A, 1C and 1D, in some embodiments. In other embodiments, the fin structures 10 made of SiGe, SiC, Ge or a Group III-V semiconductor. Metal gate structures 40 extend in the Y direction and lower source/drain (S/D) epitaxial layers 20 are disposed between the adjacent metal gates 40. In FIGS. 1C and 1D, one metal gate structure is disposed over multiple fin structures 10 (e.g., four), and one lower S/D epitaxial layer 20 is disposed over two fin structures 10 forming a merged S/D epitaxial layer 20. However, the present embodiments are not limited to this configuration. The fin structures 10 are disposed over the substrate 5 and protrude from an isolation insulating layer (e.g., shallow trench isolation (STI)).

The metal gate structure 40 includes a gate dielectric layer 42, a metallic gate electrode layer 44 and sidewall spacers 46 provided on sidewalls of the metallic gate electrode layer 44. The film thickness of the sidewall spacers 46 at the bottom of the sidewall spacers is in a range from about 3 nm to about 15 nm in some embodiments, and is in a range from about 4 nm to about 10 nm in other embodiments. In certain embodiments, a gate cap insulating layer is provided over the gate electrode layer 44 and the sidewall spacers 46 are provided on the sidewalls of the metallic gate electrode layer 44 and sidewalls of the gate cap insulating layer. Spaces between the metal gate structures 40 are filled with a first interlayer dielectric (ILD) layer 70. The ILD layer 70 includes one or more layers of silicon oxide, SiOC, SiOCN or SiCN or other low-k materials, or porous materials, or any other suitable dielectric material. The ILD layer 70 can be formed by LPCVD (low pressure chemical vapor deposition), plasma-CVD, flowable CVD or other suitable film forming methods.

In the present disclosure, a source and drain are interchangeably used and there is substantially no structural difference. The term "a source/drain" (an S/D) refers to one of a source and a drain, or both of them.

The gate cap insulating layer includes one or more layers of insulating material such as silicon nitride based material including SiN, SiON, SiCN and SiOCN, or any other suitable dielectric material. The sidewall spacers 46 are made of a different material than the cap insulating layer and include one or more layers of insulating material, such as a silicon nitride based material including SiN, SiON, SiCN and SiOCN, or any other suitable dielectric material. Various elements shown in FIGS. 1A-1D but not described above will be described later.

FIG. 1E is an enlarged cross sectional view of the metal gate structure 40. The metal gate structure 40 includes one or more layers of metal material, such as Al, Cu, W, Ti, Ta, TiN, TiAl, TiAlC, TiAlN, TaN, NiSi, CoSi, or any other suitable conductive materials. A gate dielectric layer 42 is disposed between the channel region of the fin structure 10 and the metal gate electrode layer 44 and includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof, or any other suitable dielectric material. In some embodiments, an interfacial layer made of $SiO_2$ having a 1-3 nm thickness is formed between the channel region 14 and the high-k gate dielectric layer 42.

In some embodiments, one or more work function adjustment layers 441 are interposed between the gate dielectric layer 42 and the metal material 442. The work function adjustment layer 441 is made of a conductive material such as a single layer of TiN, TaN, TaAlC, TiC, TaC, Co, Al, TiAl, HfTi, TiSi, TaSi or TiAlC, or a multilayer of two or more of these materials, or any other suitable conductive material. For an n-channel FET, one or more layers of TaN, TaAlC, TiN, TiC, Co, TiAl, HfTi, TiSi and TaSi, or any other suitable conductive material is used as the work function adjustment layer 441, and for a p-channel FET, one or more layers of TiAlC, Al, TiAl, TaN, TaAlC, TiN, TiC and Co, or any other suitable conductive material is used as the work function adjustment layer 441.

The lower S/D epitaxial layer 20 is formed in and above a recess (defined by the interface between the epitaxial layer 20 and the fin structure 10) disposed in the source/drain region of the fin structure 10, in some embodiments. As shown in FIG. 1B, the bottom portion of the lower S/D epitaxial layer 20 is embedded in the isolation insulating layer 15 and the remaining upper portion protrudes from the isolation insulating layer 15. The bottom part of the protruding portion has fin sidewall spacers 22. In some embodiments, the fin sidewall spacers 22 are made of one or more layers of a silicon nitride based material, such as silicon nitride and silicon oxynitride, or any other suitable insulating material. Further, the upper portion of the lower S/D epitaxial layer 20 has a laterally extending portion 21 in some embodiments. In certain embodiments, the laterally extending portion is merged with that of the adjacent lower S/D epitaxial layer.

Further, as shown in FIG. 1B, a contact etch-stop layer (CESL) 24 is formed on side faces of the upper portion of the lower S/D epitaxial layer 20, the fin sidewall spacers 22 and the top surface of the isolation insulating layer 15. In some embodiments, the CESL 24 is made of a different material than the cap insulating layer and the sidewall spacers 46, and includes one or more layers of insulating material, such as a silicon nitride based material including SiN, SiON, SiCN and SiOCN, or any other suitable dielectric material.

In the present embodiments, the S/D structure of a FinFET further includes an upper S/D epitaxial layer 50, as shown in FIGS. 1A and 1B. In some embodiments, since the upper S/D epitaxial layer 50 is formed after a contact opening is formed over the lower S/D epitaxial layer 20, the upper S/D epitaxial layer 50 has a lateral portion disposed on the upper portion of the CESL 24, as shown in FIG. 1B. In some embodiments, the lateral portion of the upper S/D epitaxial layer is disposed on the ILD layer 70 between two adjacent fin structures.

In some embodiments, a silicide layer 55 is formed over the upper S/D epitaxial layer 50. The silicide layer 55 is formed by reacting a metal material by a heating operation and a material of the upper S/D epitaxial layer 50. In certain embodiments, the silicide layer 55 includes one or more of TiSi, NiSi, WSi, CoSi and MoSi. In other embodiments, the silicide layer 55 includes Ge or is made of germanide.

S/D contacts 60 are disposed over the silicide layers 55, as shown in FIGS. 1A and 1B. The S/D contact 60 includes an adhesive layer 62 and a main metal layer 64, in some embodiments. The adhesive layer 62 includes Ti, TiN, Ta and/or TaN in some embodiments. The main metal layer 64 includes Co, Ni, Cu and/or W. The adhesive layer 62 is conformally formed in the contact opening and is in direct contact with the silicide layer 55 and the upper S/D epitaxial layer 50 in some embodiments. In other embodiments, the adhesive layer 62 contacts only the silicide layer 55. Further, in some embodiments, a contact liner layer 61 made of, for example, SiN, SiCN or SiOCN, is formed before forming the S/D contact 60.

FIG. 1F shows a perspective view of a FinFET structure according to embodiments of the present disclosure. The FinFET structure can be fabricated by the following operations.

First, a fin structure 310 is fabricated over a substrate 300. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The fin structure includes a bottom region and an upper region as a channel region 315. The substrate is, for example, a p-type silicon substrate with an impurity concentration in a range from about $1\times10^{15}$ cm$^{-3}$ to about $1\times10^{19}$ cm$^{-3}$, and in other embodiments, the impurity concentration in a range from about $1\times10^{16}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{19}$ cm$^{-3}$, and in other embodiments, the impurity concentration in a range from about $1\times10^{16}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP, or any other suitable semiconductor material; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD, plasma-CVD or flowable CVD. The isolation insulating layer may be formed by one or more layers of spin-on-glass (SOG), SiO, SiON, SiOCN and/or fluorine-doped silicate glass (FSG), or any other suitable dielectric material.

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. The ILD layer 370 includes one or more layers of silicon oxide, SiOC, SiOCN or SiCN or other low-k materials, or porous materials, or any other suitable dielectric material. After a planarization operation, the dummy gate structure is removed to make a gate space. Then, in the gate space, a metal gate structure 330 including a metal gate electrode and a gate dielectric layer, such as a high-k dielectric layer, is formed.

Further, in some embodiments, a cap isolation layer 340 is formed over the metal gate structure 330, so as to obtain the Fin FET structure shown in FIG. 1F.

In FIG. 1F, parts of the metal gate structure 330, the cap isolation layer 340, sidewalls spacer 350 and the ILD 370 are cut to show the underlying structure. In some embodiments, the adjacent source/drain epitaxial regions 360 are merged with each other, and a silicide layer is formed on the merged source/drain regions.

The metal gate structure 330, the cap isolation layer 340, sidewalls spacer 350, source/drain 360 and the ILD 370 of FIG. 1F substantially correspond to the gate dielectric layer 42 and metal gate electrode 44, the cap insulating layers, the sidewall spacers 46, the lower source/drain epitaxial layers 20 and the interlayer dielectric layer (ILD) 70, of FIGS. 1A-1E, respectively.

Figures 2A, 2B:
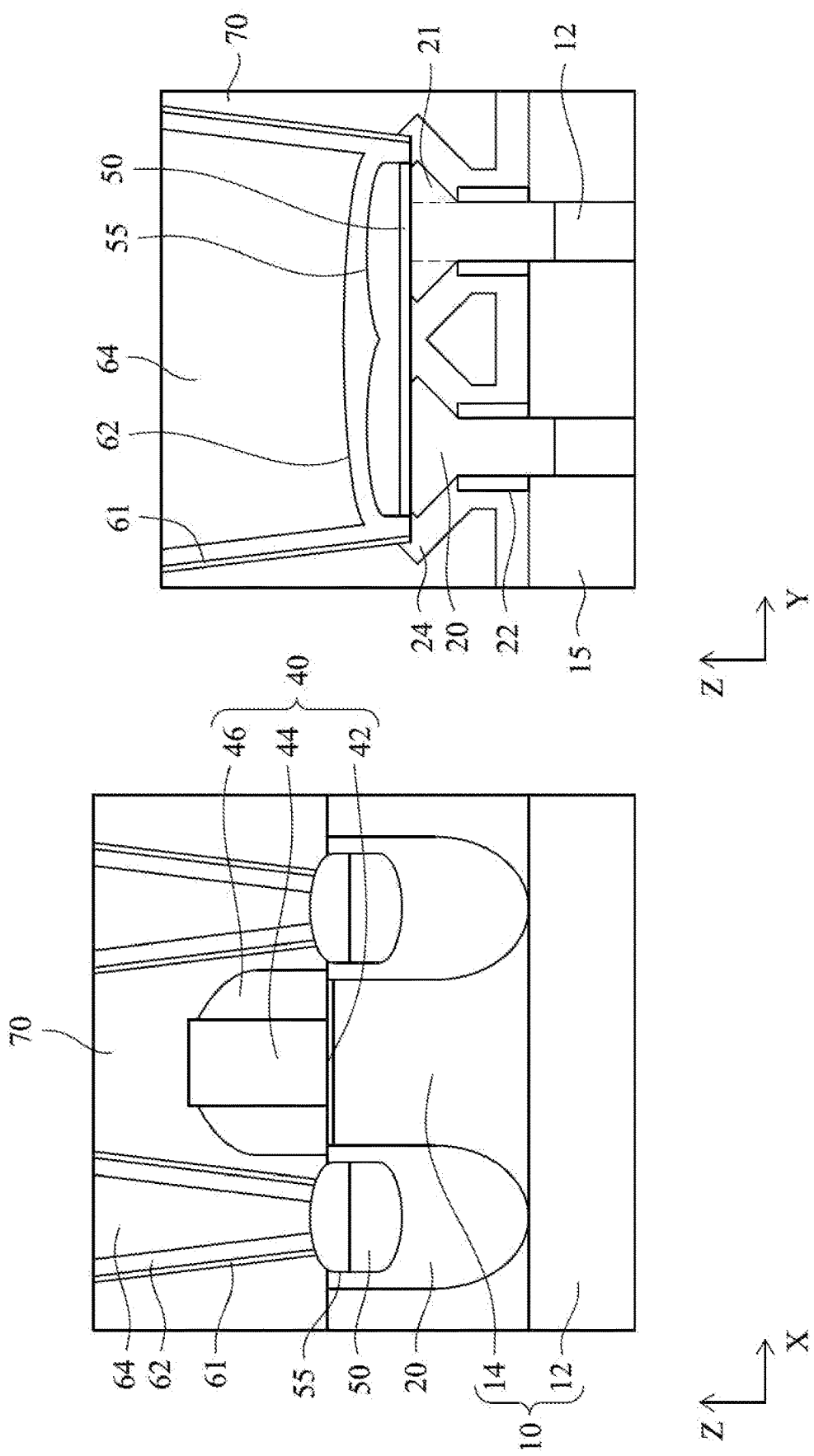
FIG. 2A shows a cross sectional view of a semiconductor device and FIG. 2B is another cross sectional view of the semiconductor device according to other embodiments of the present disclosure.

FIG. 2A shows a cross sectional view of a semiconductor device in the X direction and FIG. 2B is a cross sectional view of the semiconductor device in the Y direction, according to other embodiments of the present disclosure. Material, configuration, dimensions and/or processes the same as or similar to the foregoing embodiments described with respect to FIGS. 1A-1F may be employed in the following embodiments, and detailed explanation thereof may be omitted.

In FIGS. 2A and 2B, when the contact opening for the S/D contact 70 is formed, the lower S/D epitaxial layer 20 is more deeply etched than the case of FIGS. 1A and 1B. In such a case, the upper S/D epitaxial layer 50 is formed on relatively wider areas of the etched lower S/D epitaxial layer 20. In some embodiments, the upper S/D epitaxial layer 50 laterally grows and merges with the adjacent upper S/D epitaxial layer, as shown in FIG. 2B. Further, the silicide layer 55 may also be formed as one silicide layer. Similar to FIG. 1B, the upper S/D epitaxial layer 50 has a lateral portion disposed on the upper portion of the CESL 24, as shown in FIG. 2B. In this embodiment, since the upper S/D epitaxial layer 50 can be formed larger in volume or in area, it is possible to further reduce the S/D contact resistance.

FIGS. 3-19B show various stages of a sequential semiconductor device fabrication process according to one embodiment of the present disclosure. In FIGS. 7A-19B, the "A" figures (FIGS. 7A, 8A, . . . ) show cross sectional views of an n-channel FinFET, and the "B" figures (FIGS. 7B, 8B, . . . ) show cross sectional views of a p-channel FinFET. It is understood that additional operations can be provided before, during, and after processes shown by FIGS. 3-19B, and some of the operations described below can be replaced or eliminated for additional embodiments of the method. The order of the operations/processes may be interchangeable. Material, configuration, dimensions and/or processes the same as or similar to the foregoing embodiments described with respect to FIGS. 1A-2B may be employed in the following embodiments, and detailed explanation thereof may be omitted.

The manufacturing operations of FIGS. 3-6 are substantially common to both an n-channel (n-type) FinFET and a p-channel (p-type) FinFET.

Figure 3:
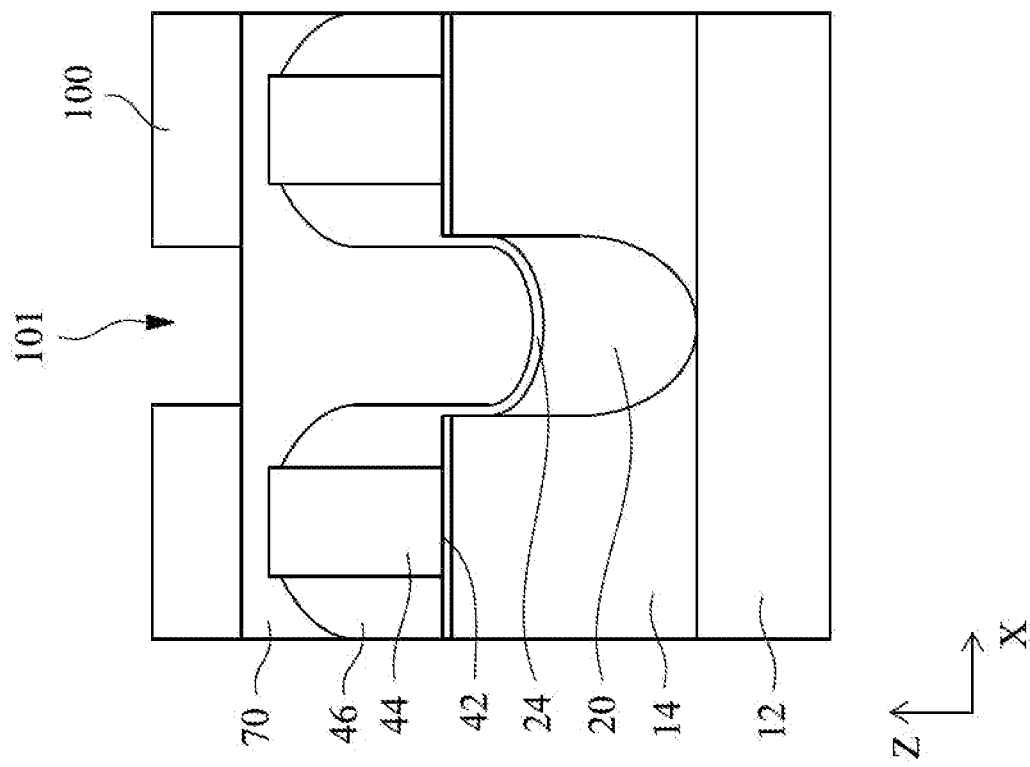
FIG. 3 shows one of the various stages of a sequential manufacturing operation for a semiconductor device according to embodiments of the present disclosure.

After the interlayer dielectric (ILD) layer 70 is formed over the underlying structure including the metal gate structure (42, 44 and 46) and the lower S/D epitaxial layer 20, a first mask layer 100 having an opening pattern 101 is formed over the ILD layer 70, as shown in FIG. 3. The first mask layer 100 is a photo resist pattern in some embodiments, and is a hard mask layer including silicon oxide, silicon nitride or any other suitable material, in other embodiments.

Figure 4A:
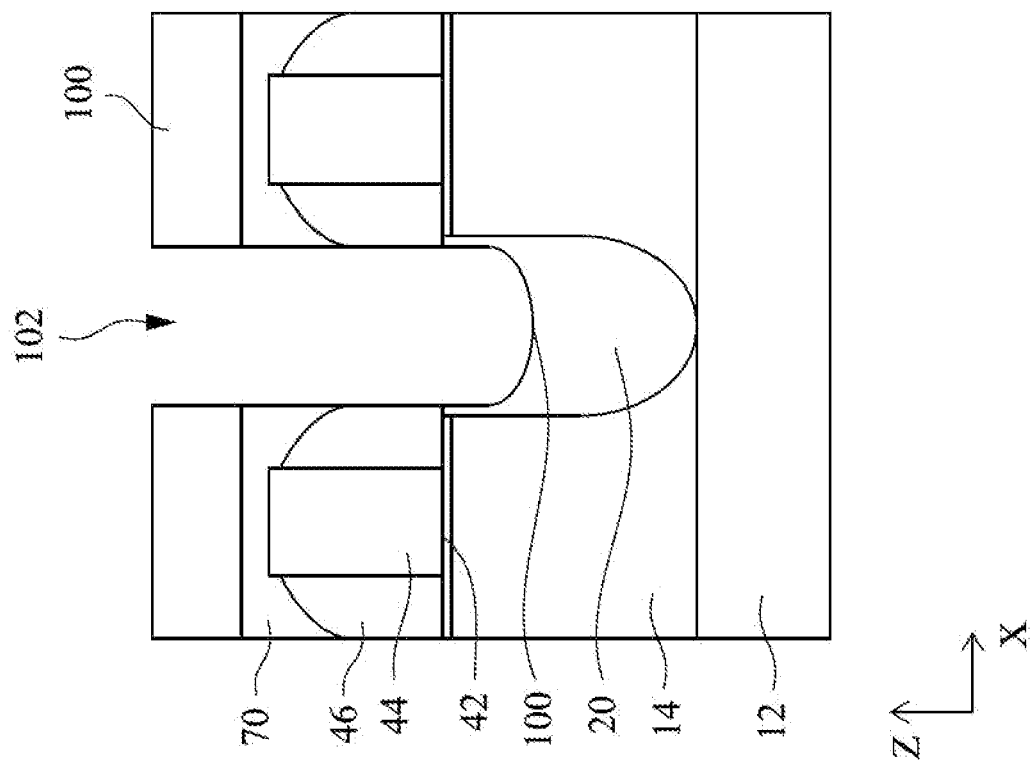

By using the first mask layer 100 as an etching mask, the ILD layer 70, the contact etch stop layer (CESL) 24 and the lower S/D epitaxial layer 20 are sequentially etched, thereby forming an S/D contact opening 102, as shown in FIG. 4A.

FIGS. 4B and 4C show the cross sectional views showing one of the various stages of the sequential manufacturing operation for a semiconductor device, along the Y direction with different etching depths. In FIG. 4B, the height H1 is an original height of the lower S/D epitaxial layer 20 before the contact opening 102 is formed, and H2 is a height of the fin sidewall spacer 22. The depths D1 and D2 are etching depths (amounts) of the lower S/D epitaxial layer 20.

In some embodiments, the etching depth D1 and D2 satisfy, 0<D1, D2<(H1−H2)/2. In FIG. 4B, a part of the ILD layer 70 remains at a V-shape portion between two S/D structures, and in FIG. 4C, no ILD layer remains between two S/D structures due to the deeper etching. In other words, there is no V-shape portion formed by the CESL 24. When the etching of the lower S/D epitaxial layer 20 stops at the level at which the lower S/D epitaxial layer 20 has the largest width in the Y direction, the etched upper surface of the lower S/D epitaxial layer 20 can have the largest area. When the fin pitch FP is in a range from about 10 nm to about 40 nm, larger D1 or D2 will result in lower S/D contact resistance.

Figures 5, 6:
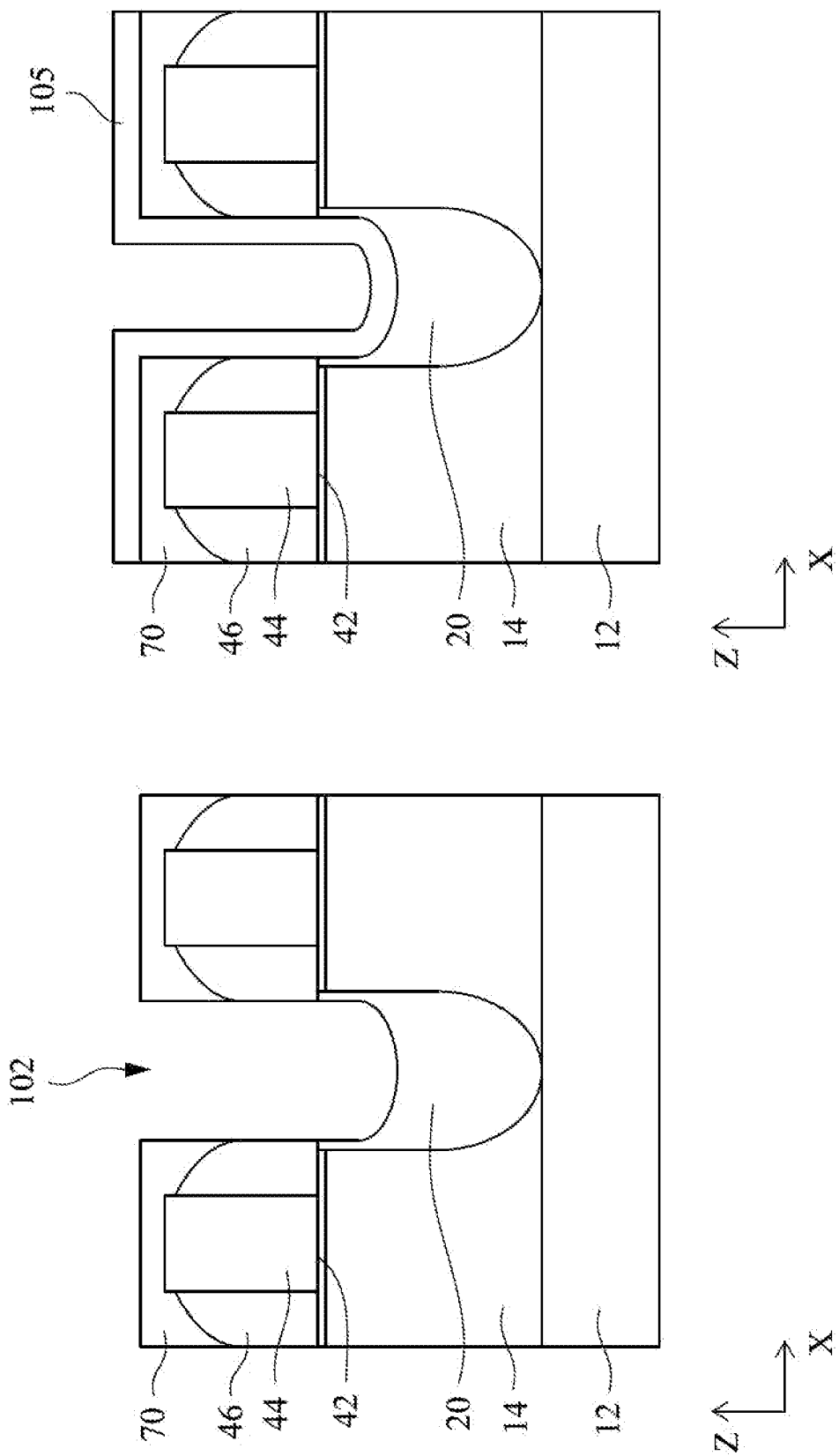
FIG. 5 shows one of the various stages of a sequential manufacturing operation for a semiconductor device according to embodiments of the present disclosure.
FIG. 6 shows one of the various stages of a sequential manufacturing operation for a semiconductor device according to embodiments of the present disclosure.

After the S/D contact opening 102 is formed, the first mask layer 100 is removed, as shown in FIG. 5.

Then, as shown in FIG. 6, a first cover layer 105 is conformally formed in the contact opening 102 and on the upper surface of the ILD layer 70. The first cover layer 105 includes one or more of SiN, SiOC, SiOCN, SiCO or any suitable dielectric material, and has a thickness in a range from about 1 nm to about 10 nm, in some embodiments, and the a thickness can be in a range from about 2 nm to about 8 nm in other embodiments. The first cover layer 105 can be formed by CVD or ALD.

Figure 7B:
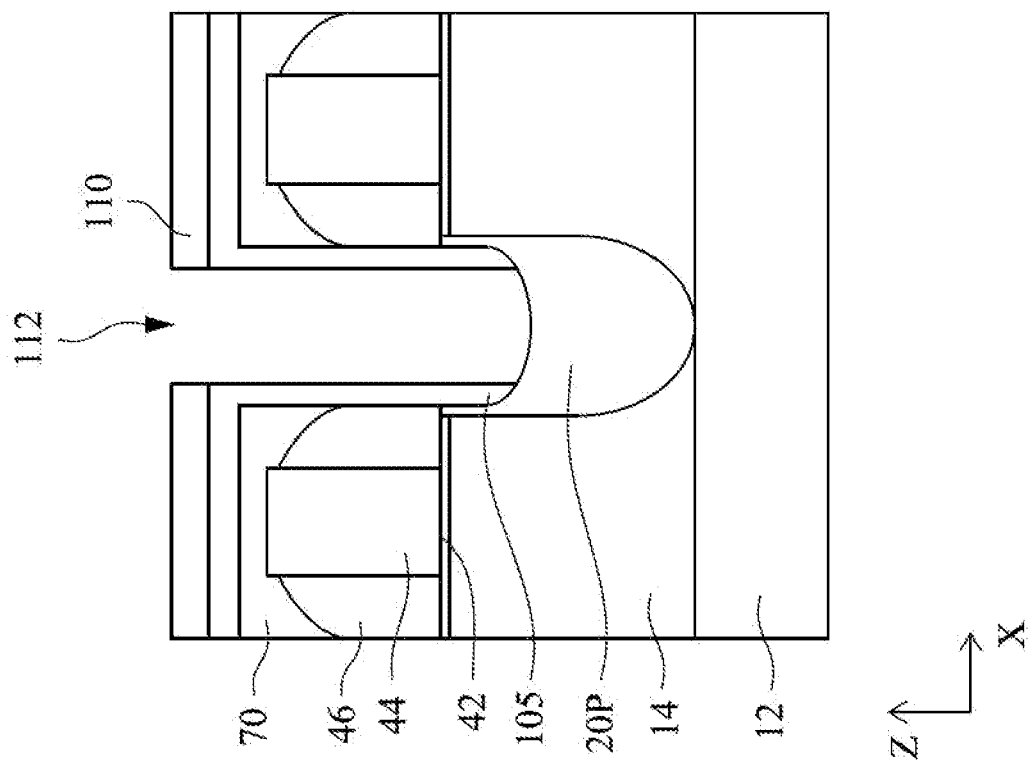
FIGS. 7A and 7B show one of the various stages of a sequential manufacturing operation for a semiconductor device according to embodiments of the present disclosure.
Figure 7A:
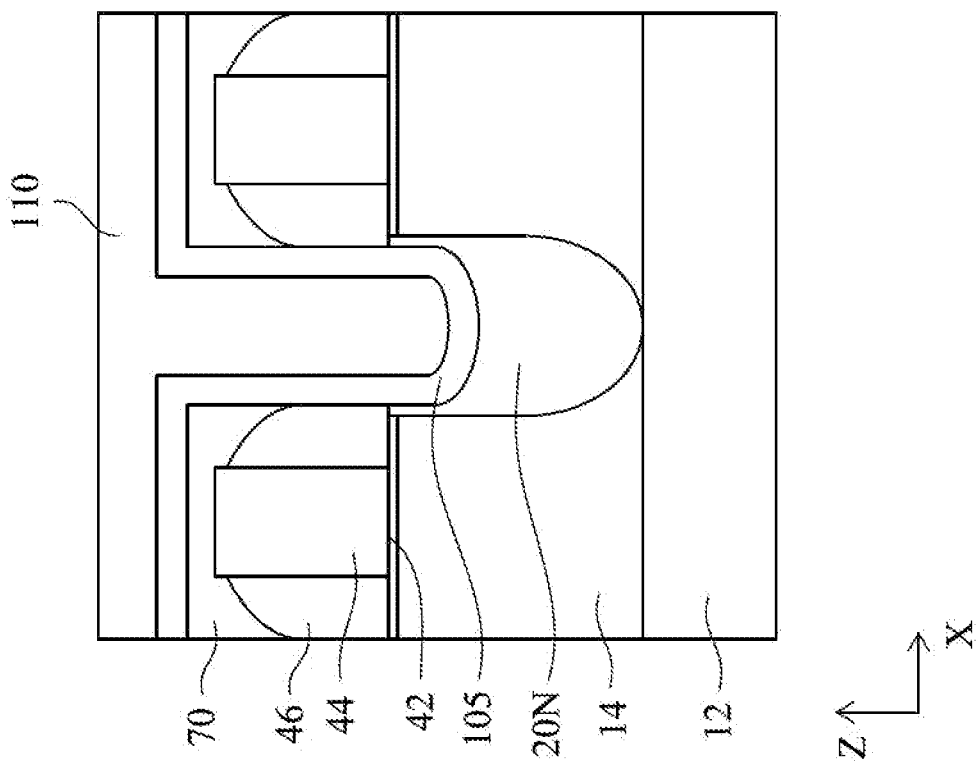

FIGS. 7A and 7B show one of the various stages of a sequential manufacturing operation for a semiconductor device according to embodiments of the present disclosure. FIG. 7A shows a cross sectional view for the n-channel FinFET, and FIG. 7B shows a cross sectional view for the p-channel FinFET. In some embodiments, the n-channel FinFET includes a lower S/D epitaxial layer 20N and the p-channel FinFET includes a lower S/D epitaxial layer 20P different from lower S/D epitaxial layer 20N.

A second mask layer 110 is formed over the first cover layer 105, and the first cover layer 105 is patterned to form an opening 112 by using the second mask layer 110 as an etching mask for the p-type region as shown in FIG. 7B, while the n-type region is covered by the second mask layer 110, as shown in FIG. 7A. The second mask layer 110 is a photo resist pattern in some embodiments, and is a hard mask layer including silicon oxide, silicon nitride or any other suitable material, in other embodiments.

Figure 8B:
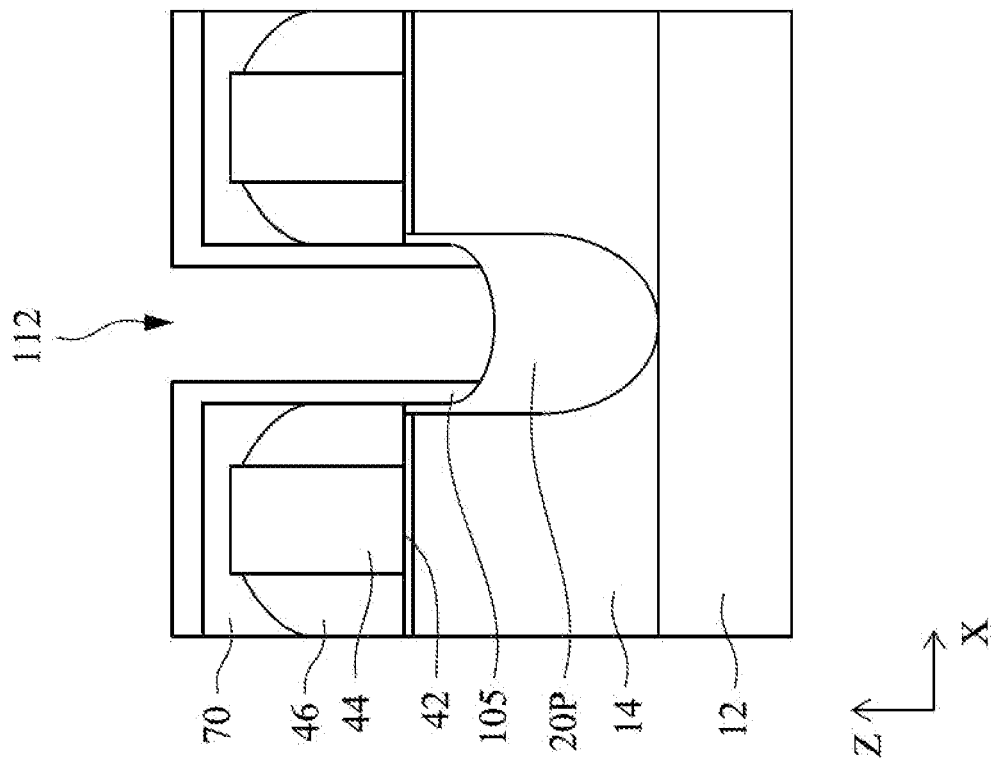
FIGS. 8A and 8B show one of the various stages of a sequential manufacturing operation for a semiconductor device according to embodiments of the present disclosure.
Figure 8A:
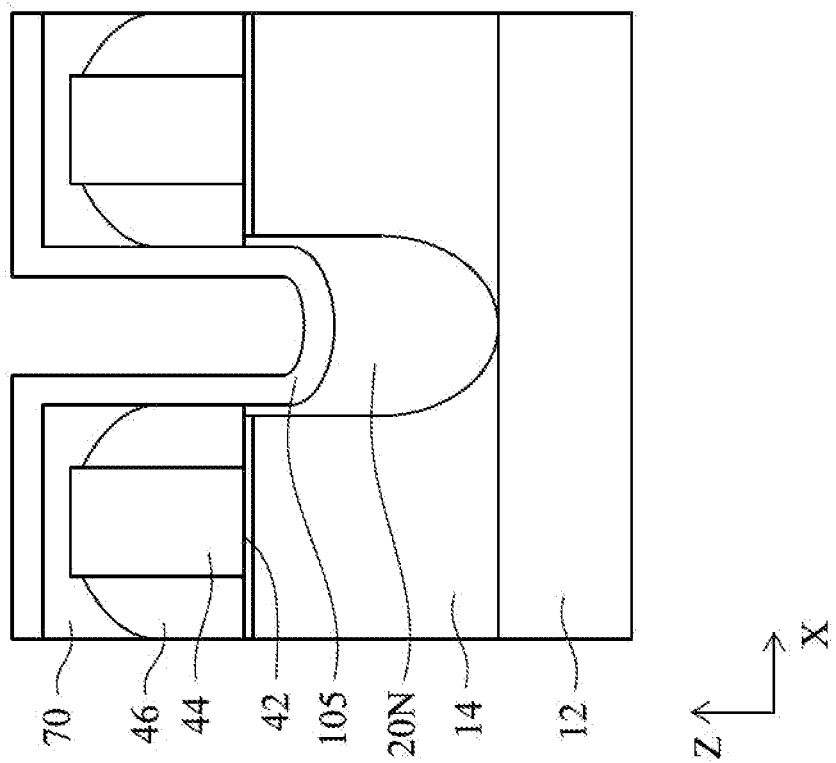

After the opening 112 is formed, the second mask layer 110 is removed, as shown in FIGS. 8A and 8B.

Figures 9A, 9B:
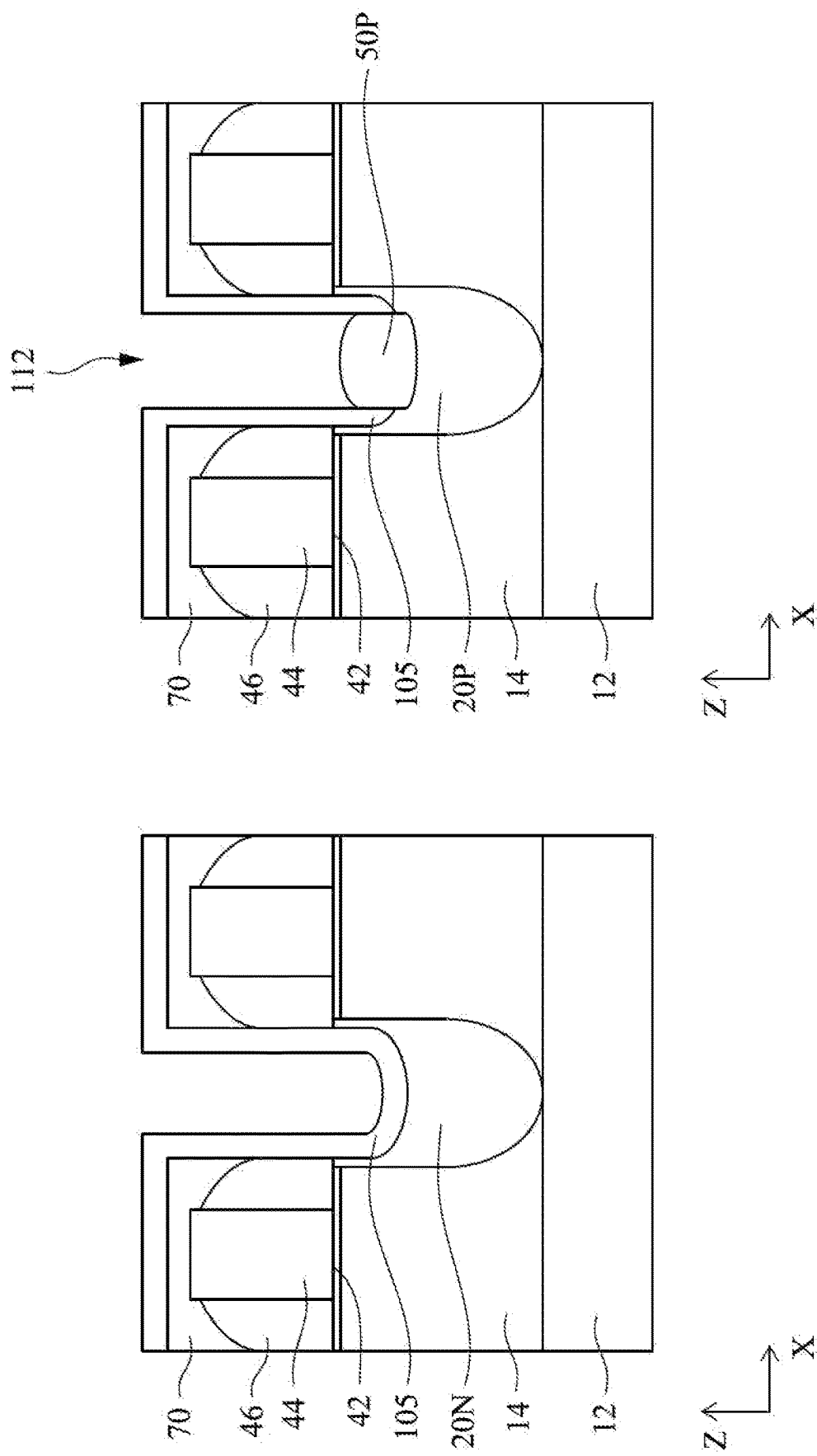
FIGS. 9A and 9B show one of the various stages of a sequential manufacturing operation for a semiconductor device according to embodiments of the present disclosure.

Then, as shown in FIG. 9B, an upper S/D epitaxial layer 50P for the p-channel FinFET is formed, while the n-type region shown in FIG. 9A is protected by the first cover layer 105. The upper S/D epitaxial layer 50P can be formed by metal organic CVD (MOCVD), ALD and/or molecular beam epitaxy (MBE).

For the p-channel FET, in some embodiments, the upper S/D epitaxial layer 50P includes SiB, SiGe, SiBGe or GaAs. In other embodiments, the lower S/D epitaxial layer 20P and the upper S/D epitaxial layer 50P contain Ge, and a concentration of Ge in the upper S/D epitaxial layer 50P is higher than a concentration of Ge in the lower S/D epitaxial layer 20P in some embodiments. In certain embodiments, the lower S/D epitaxial layer 20P includes $Si_{1-x}Ge_x$, where $0.15 \leq x \leq 0.8$, and the upper S/D epitaxial layer 50P includes $Si_{1-y}Ge_y$, where $0.2 \leq y \leq 1.0$ and $x<y$. Further, at least one of the lower S/D epitaxial layer and the upper S/D epitaxial layer further contains B (boron), and a concentration of B is in a range from about $1.0 \times 10^{20}$ cm$^{-3}$ to about $6.0 \times 10^{21}$ cm$^{-3}$ in some embodiments, and is in a range from about $5.0 \times 10^{20}$ cm$^{-3}$ to about $1.0 \times 10^{21}$ cm$^{-3}$ in other embodiments.

Figures 10A, 10B:
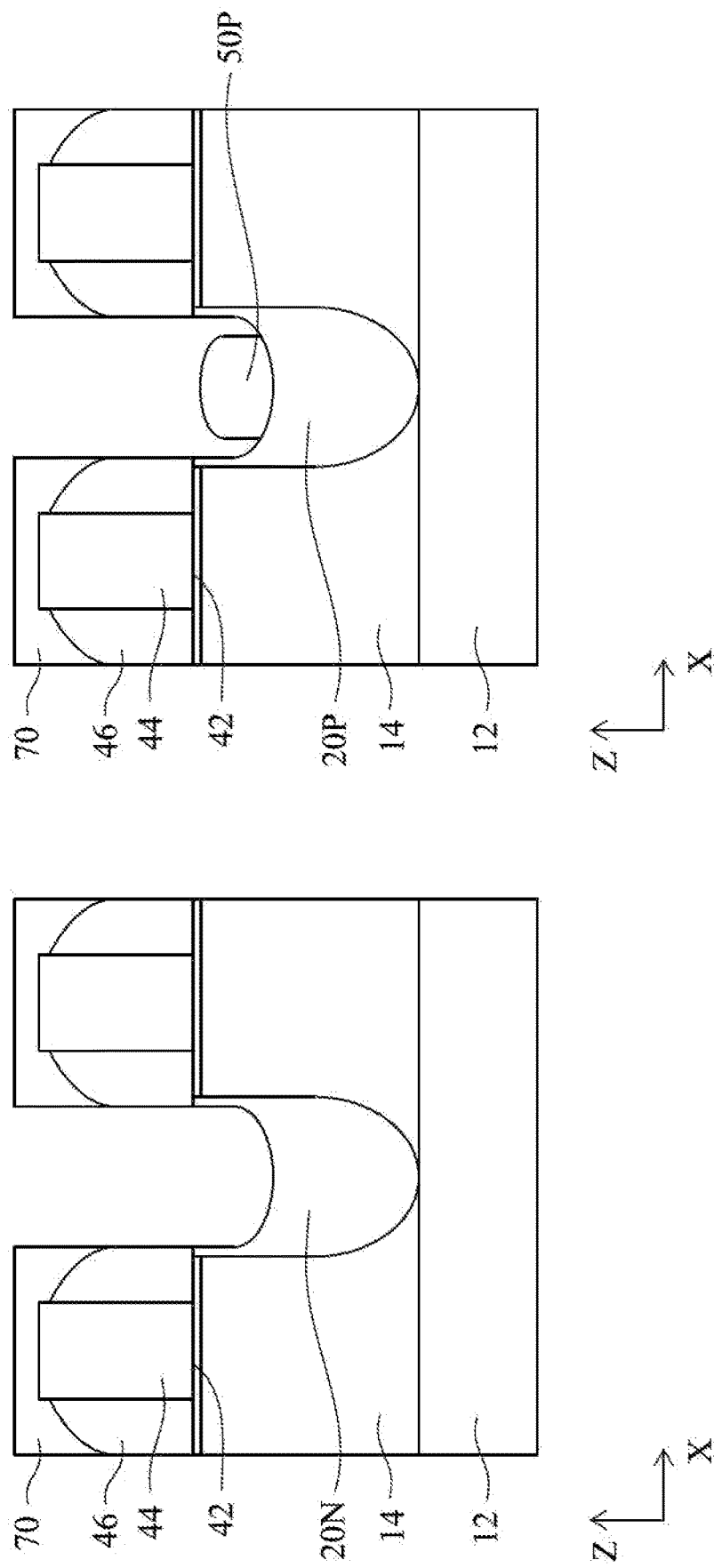
FIGS. 10A and 10B show one of the various stages of a sequential manufacturing operation for a semiconductor device according to embodiments of the present disclosure.

Then, the first cover layer 105 is removed by appropriate etching and/or cleaning operations, as shown in FIGS. 10A and 10B.

Figure 11B:
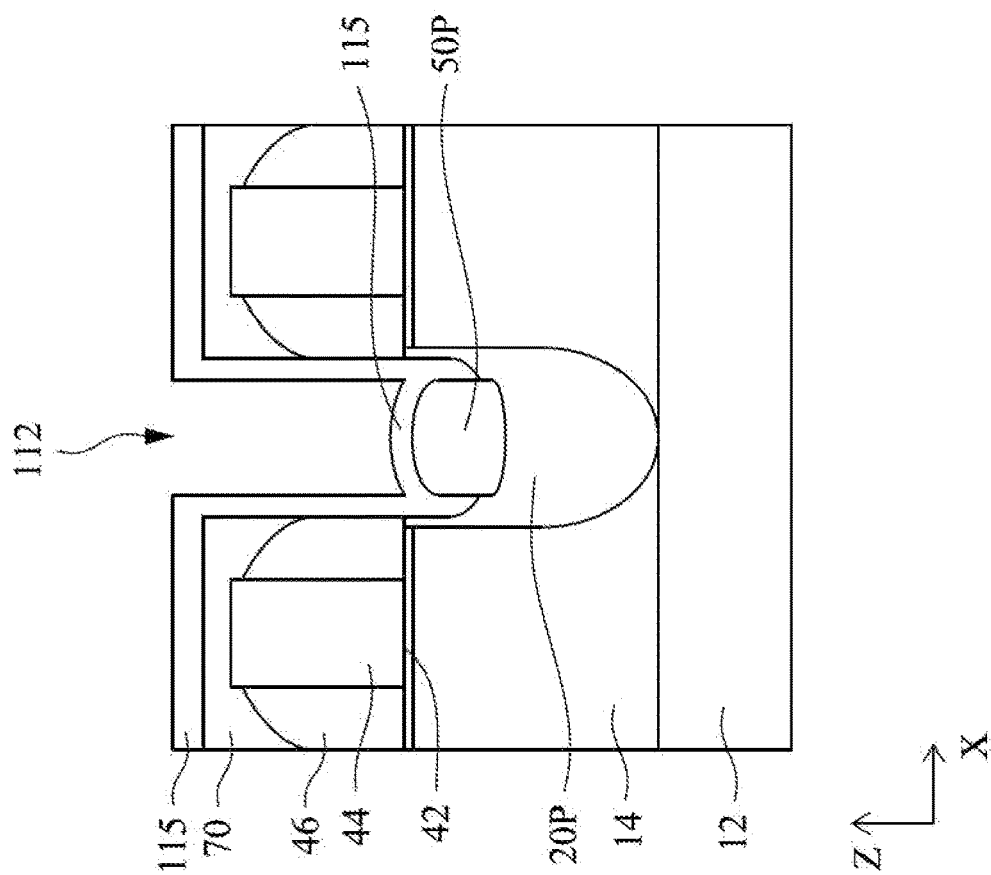
FIGS. 11A and 11B show one of the various stages of a sequential manufacturing operation for a semiconductor device according to embodiments of the present disclosure.
Figure 11A:
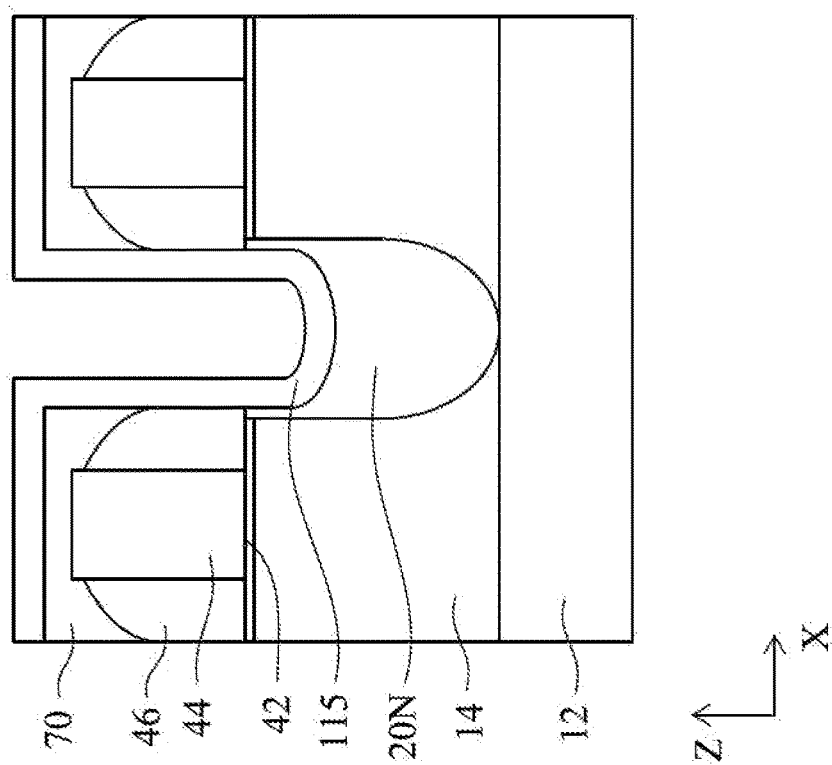

Subsequently, a second cover layer 115 is conformally formed for both the n-channel region and the p-channel region in the contact openings and on the upper surface of the ILD layer 70, as shown in FIGS. 11A and 11B. The second cover layer 115 includes one or more of SiN, SiOC, SiOCN, SiCO or any suitable dielectric material, and has a thickness in a range from about 1 nm to about 10 nm, in some embodiments, and the a thickness can be in a range from about 2 nm to about 8 nm in other embodiments. The second cover layer 115 can be formed by CVD or ALD.

Figures 12A, 12B:
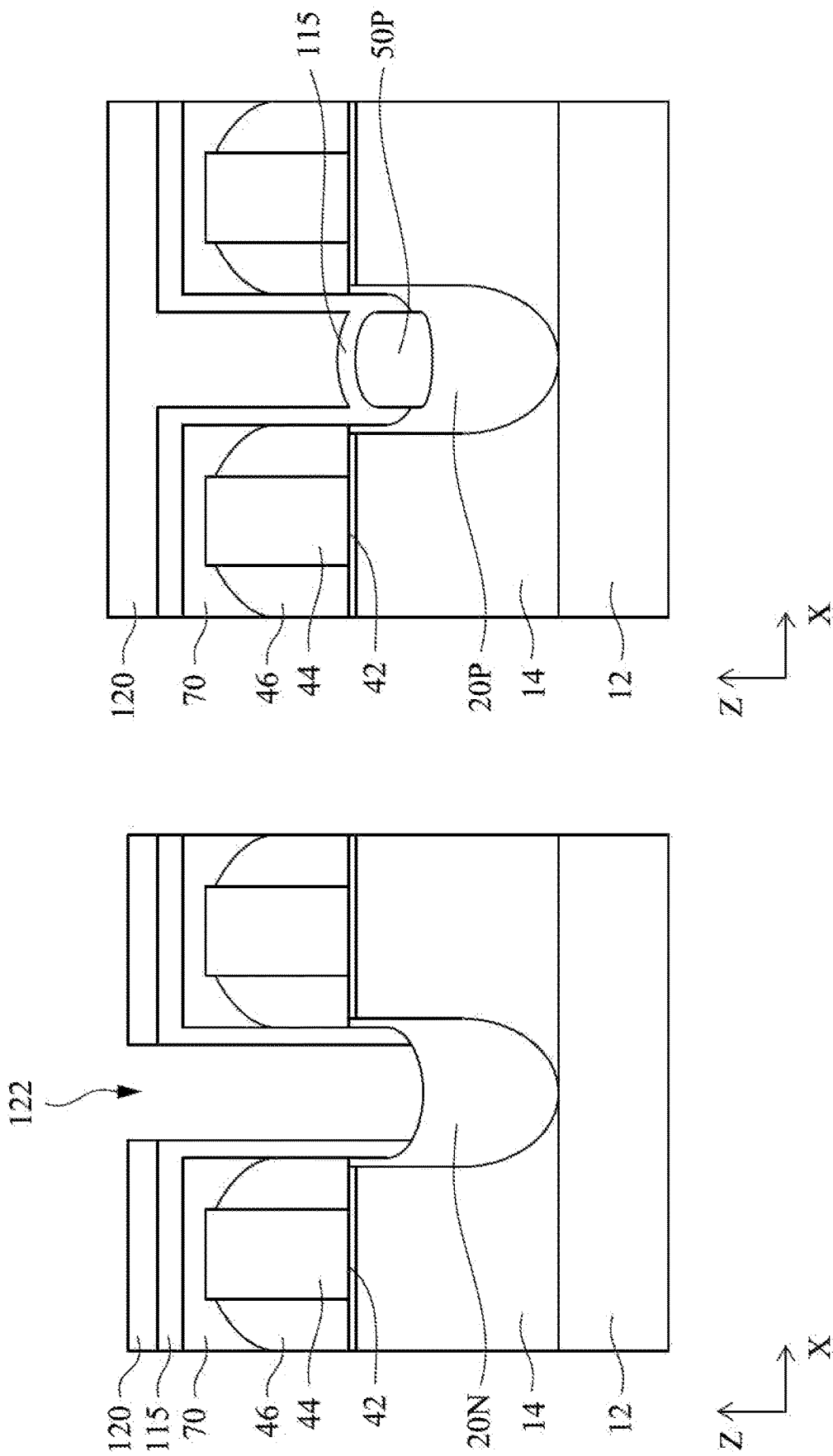
FIGS. 12A and 12B show one of the various stages of a sequential manufacturing operation for a semiconductor device according to embodiments of the present disclosure.

A third mask layer 120 is formed over the second cover layer 115, and the second cover layer 115 is patterned to form an opening 122 by using the third mask layer 120 as an etching mask for the n-type region as shown in FIG. 12A, while the p-type region is covered by the third mask layer 120, as shown in FIG. 12B. The third mask layer 120 is a photo resist pattern in some embodiments, and is a hard mask layer including silicon oxide, silicon nitride or any other suitable material, in other embodiments.

Figure 13B:
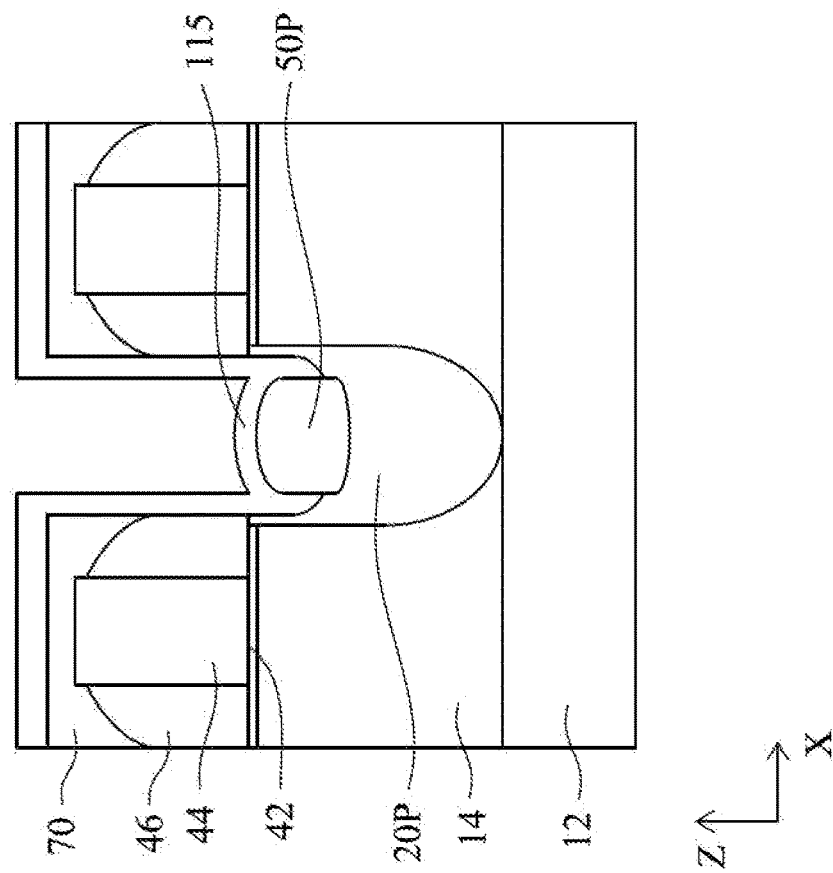
FIGS. 13A and 13B show one of the various stages of a sequential manufacturing operation for a semiconductor device according to embodiments of the present disclosure.
Figure 13A:
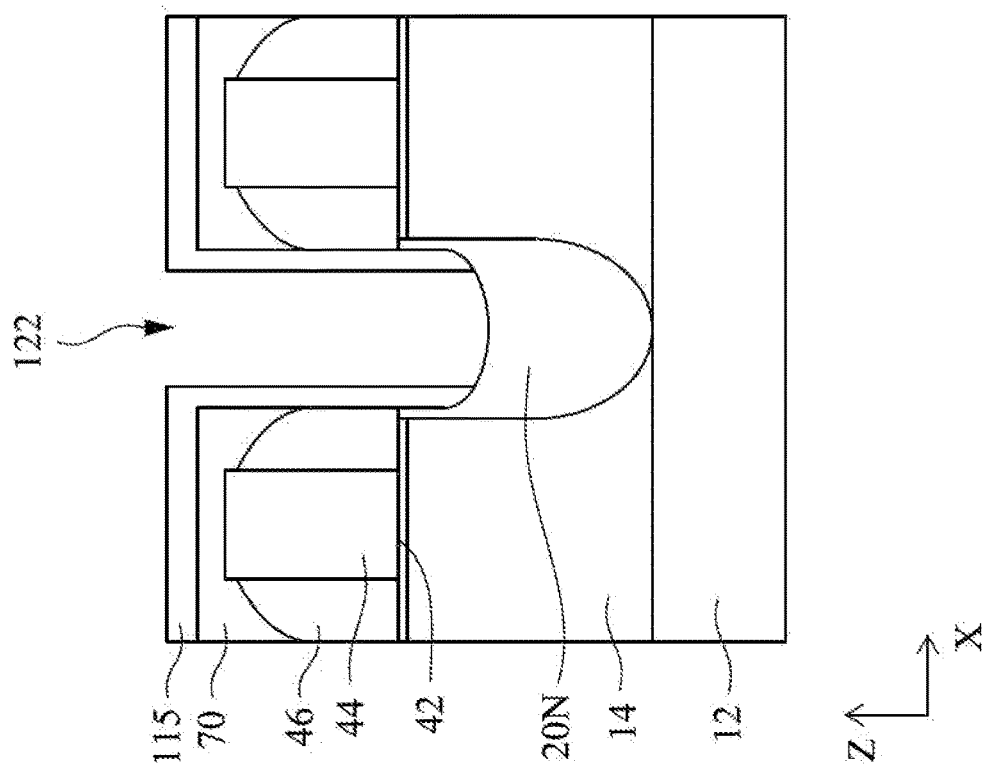

After the opening 122 is formed, the third mask layer 120 is removed, as shown in FIGS. 13A and 13B.

Figure 14B:
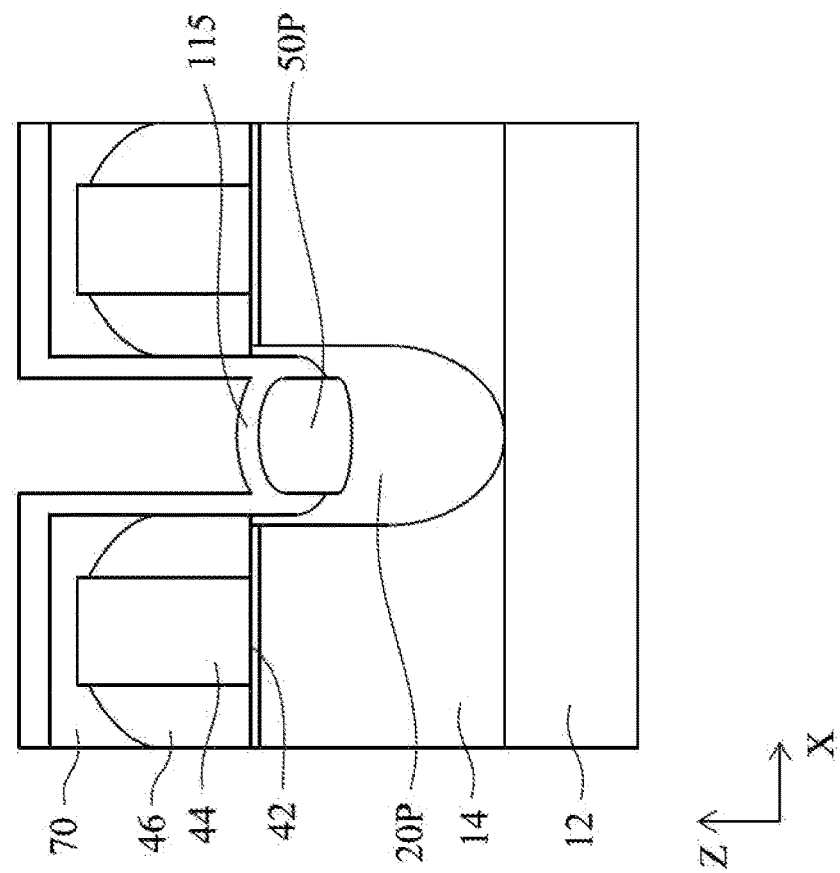
FIGS. 14A and 14B show one of the various stages of a sequential manufacturing operation for a semiconductor device according to embodiments of the present disclosure.
Figure 14A:
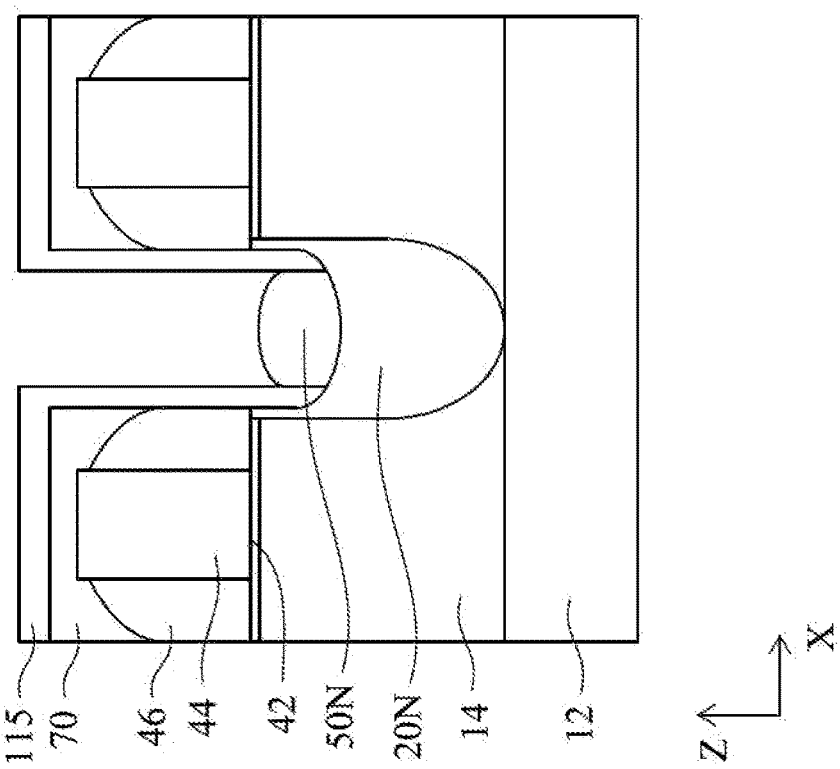

Then, as shown in FIG. 14A, an upper S/D epitaxial layer 50N for the n-channel FinFET is formed, while the p-type region is protected by the second cover layer 115 as shown in FIG. 14B. The upper S/D epitaxial layer 50N can be formed by metal organic CVD (MOCVD), ALD and/or molecular beam epitaxy (MBE).

For the n-channel FET, in some embodiments, the upper S/D epitaxial layer 50N includes SiP, InP, SiCP, SiC or GaInP. In some embodiments, the lower S/D epitaxial layer 20N also includes SiP, InP, SiCP, SiC or GaInP, but may have a different composition than the upper S/D epitaxial layer 50N. "Different composition" means, for example, a different material, a different elemental composition ratio, a different dopant concentration, and the like. In some embodiments, the lower S/D epitaxial layer 20N is Si. In certain embodiments, the lower S/D epitaxial layer 20N and the upper S/D epitaxial layer 50N contain P (phosphorous), and a concentration of P in the upper S/D epitaxial layer is higher than a concentration of P in the lower S/D epitaxial layer 20N. Further, when the upper S/D epitaxial layer contains P, a concentration of P is in a range from about $1.0 \times 10^{20}$ cm$^{-3}$ to about $6.0 \times 10^{21}$ cm$^{-3}$ in some embodiments, and is in a range from about $5.0 \times 10^{20}$ cm$^{-3}$ to about $1.0 \times 10^{21}$ cm$^{-3}$ in other embodiments.

Then, the second cover layer 115 is removed by appropriate etching and/or cleaning operations, as shown in FIGS. 15A and 15B.

Figure 16B:
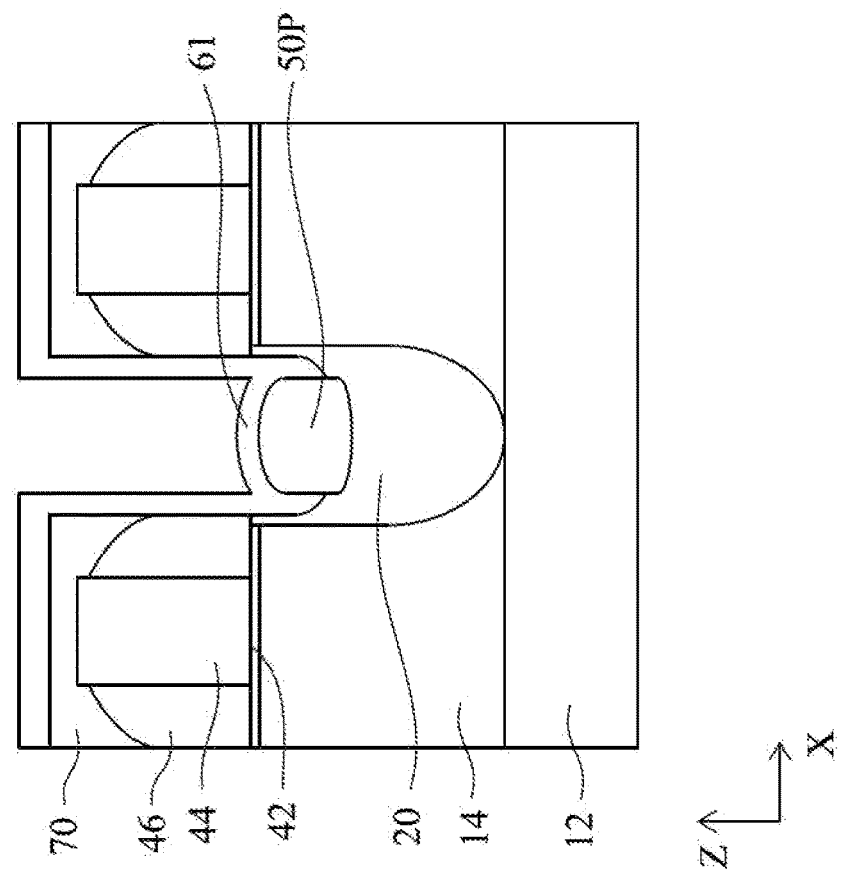
FIGS. 16A and 16B show one of the various stages of a sequential manufacturing operation for a semiconductor device according to embodiments of the present disclosure.
Figure 16A:
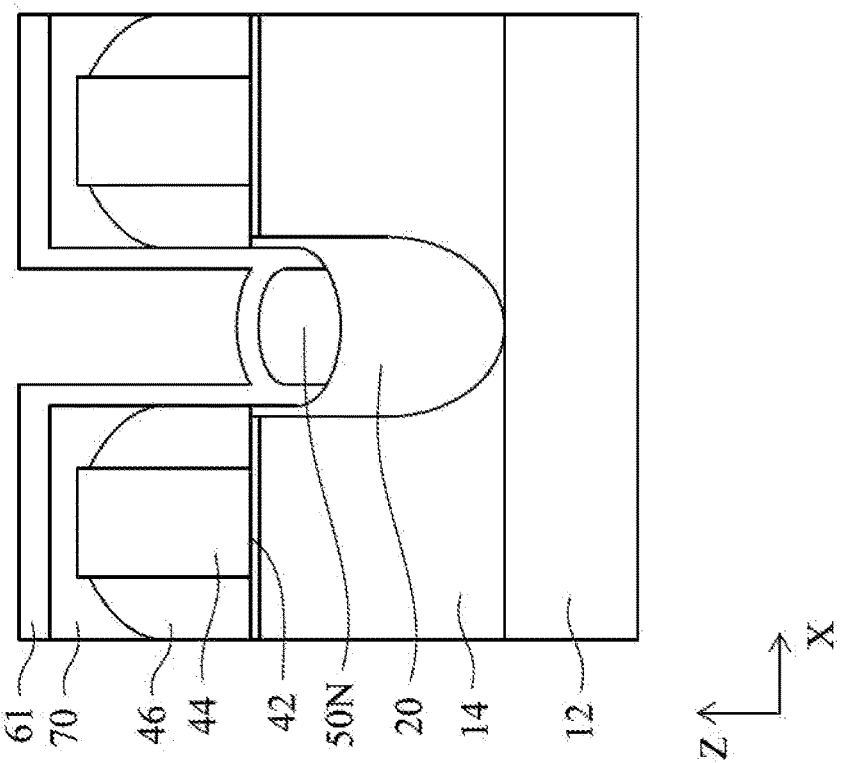

Further, as shown in FIGS. 16A and 16B, a contact liner layer 61 is formed over the upper S/D epitaxial layers 50P, 50N inside the openings and over the upper surface of the ILD layer 70. The contact liner layer 61 can be formed by CVD or ALD. The contact liner layer 61 includes one or more of SiN, SiOC, SiOCN, SiCO or any suitable dielectric material, and has a thickness in a range from about 1 nm to about 10 nm, in some embodiments, and the a thickness can be in a range from about 2 nm to about 8 nm in other embodiments.

Figure 17B:
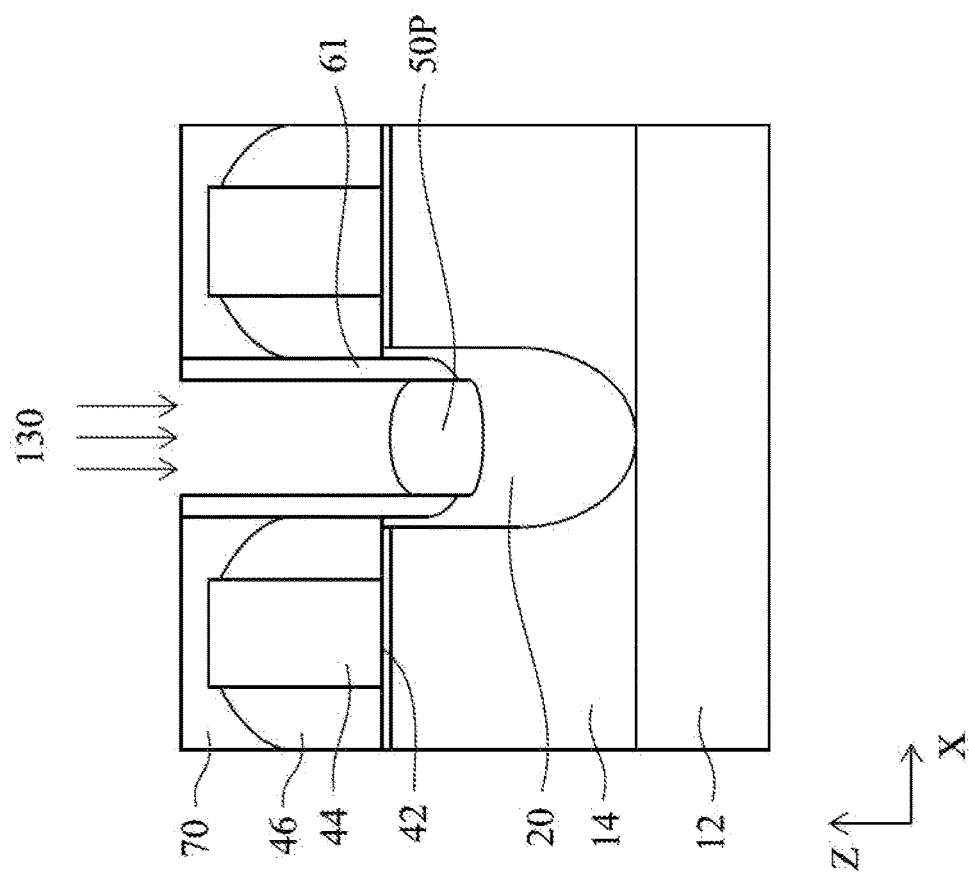
FIGS. 17A and 17B show one of the various stages of a sequential manufacturing operation for a semiconductor device according to embodiments of the present disclosure.
Figure 17A:
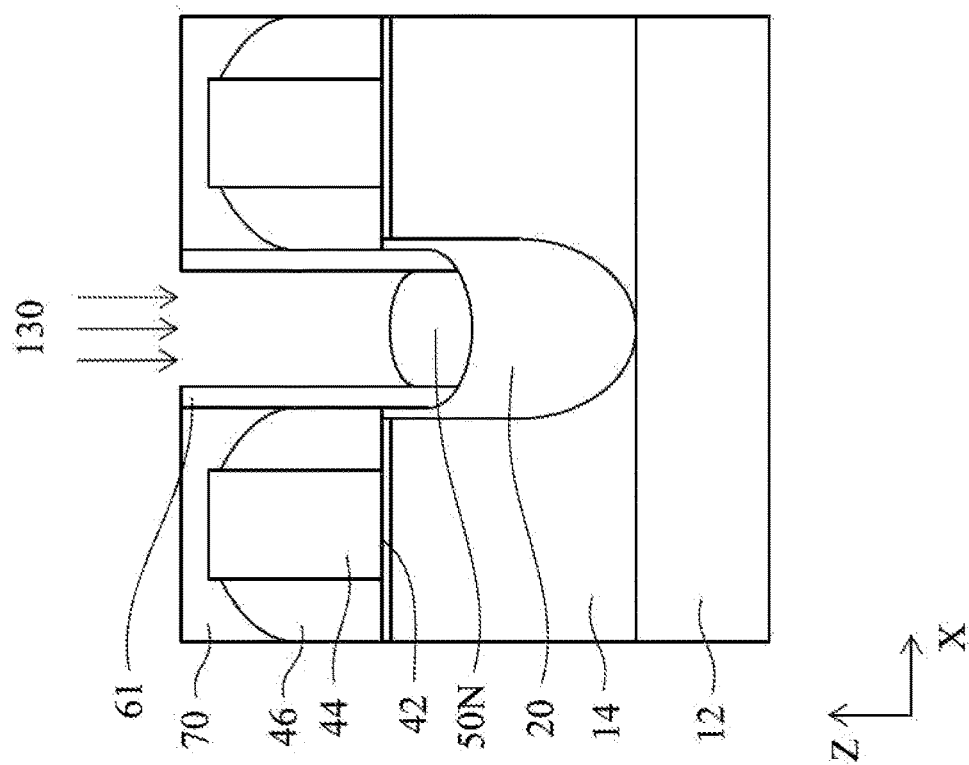

By using a patterning operation, the contact liner layer 61 formed over the upper S/D epitaxial layers 50P, 50N is removed, as shown in FIGS. 17A and 17B. In some embodiments, a pre-amorphous implantation 130 is performed on the exposed upper S/D epitaxial layers 50P, 50N. In some embodiments, germanium (Ge) is implanted to make the upper portion of the upper S/D epitaxial layers 50P, 50N amorphous.

Figure 18A:
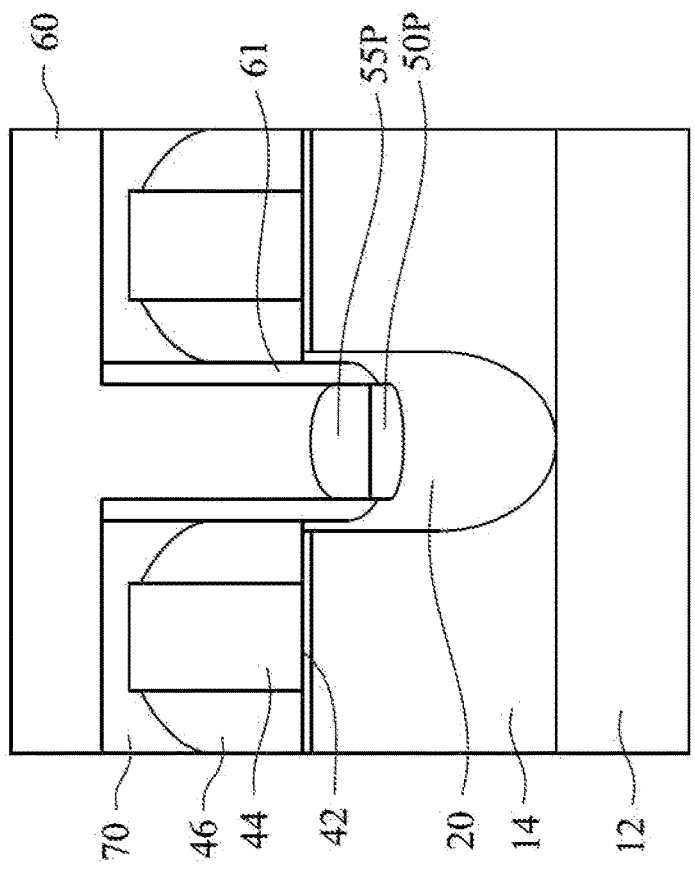
FIGS. 18A and 18B show one of the various stages of a sequential manufacturing operation for a semiconductor device according to embodiments of the present disclosure.
Figure 18B:
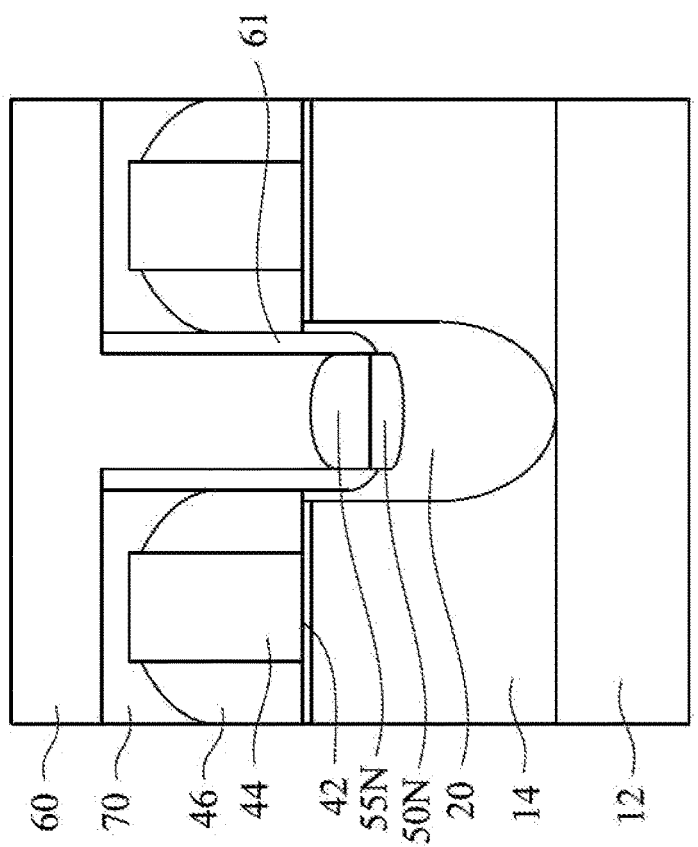

Then, a metal layer for silicide formation (e.g., W, Ni, Co, Ti, and/or Mo) is deposited. The metal layer can be formed by CVD, PVD or ALD, or any other suitable film formation methods. After the metal layer is formed, a thermal operation, such as a rapid thermal annealing operation, is performed at about 450° C. to about 1000° C. to form a silicide layers 55N and 55P from the components of the upper S/D epitaxial layers 50N, 50P (e.g., Si) and the metal (e.g., W, Ni, Co, Ti, and/or Mo) of the metal layer, as shown in FIGS. 18A and 18B. In some embodiments, the thermal operation is not performed because the silicide layer can be formed during the formation of the metal layer.

After the silicide layers 55N, 55P are formed, a conductive material layer 60 is formed to fill the contact opening. In some embodiments, the conductive material layer 60 includes a blanket layer of an adhesive (glue) layer 62 and a body metal layer 64, as shown in FIGS. 1A and 1B. The adhesive layer 62 includes one or more layers of conductive materials. In some embodiments, the adhesive layer 62 includes a TiN layer formed on a Ti layer. Any other suitable conductive material can be used. The thickness of each of the TiN layer and the Ti layer is in a range from about 1 nm to about 5 nm in some embodiments, and the a thickness can be in a range from about 2 nm to about 3 nm in other embodiments. The adhesive layer 62 can be formed by CVD, PVD, ALD, electro-plating or a combination thereof, or other suitable film forming methods. The adhesive layer 62 is used to prevent the body metal layer from peeling off. In some embodiments, no adhesive layer is used and the body metal layer is directly formed in the contact openings. In such cases, the body metal layer 64 is in direct contact with the silicide layers 55N, 55P.

In some embodiments, the Ti layer of the adhesive layer can be used as the metal layer for forming a silicide layer.

The body metal layer 64 is one of Co, W, Mo and Cu, or any other suitable conductive material in some embodiments. In one embodiment, Co is used as the body metal layer. The body metal layer can be formed by CVD, PVD, ALD, electro-plating or a combination thereof or other suitable film forming methods. After the conductive material layer 60 is formed, a planarization operation, such as chemical mechanical polishing (CMP) or etch-back operations, is performed so as to remove the excess materials, thereby forming S/D contact 60, as shown in FIGS. 19A and 19B.

Figures 19A, 19B:
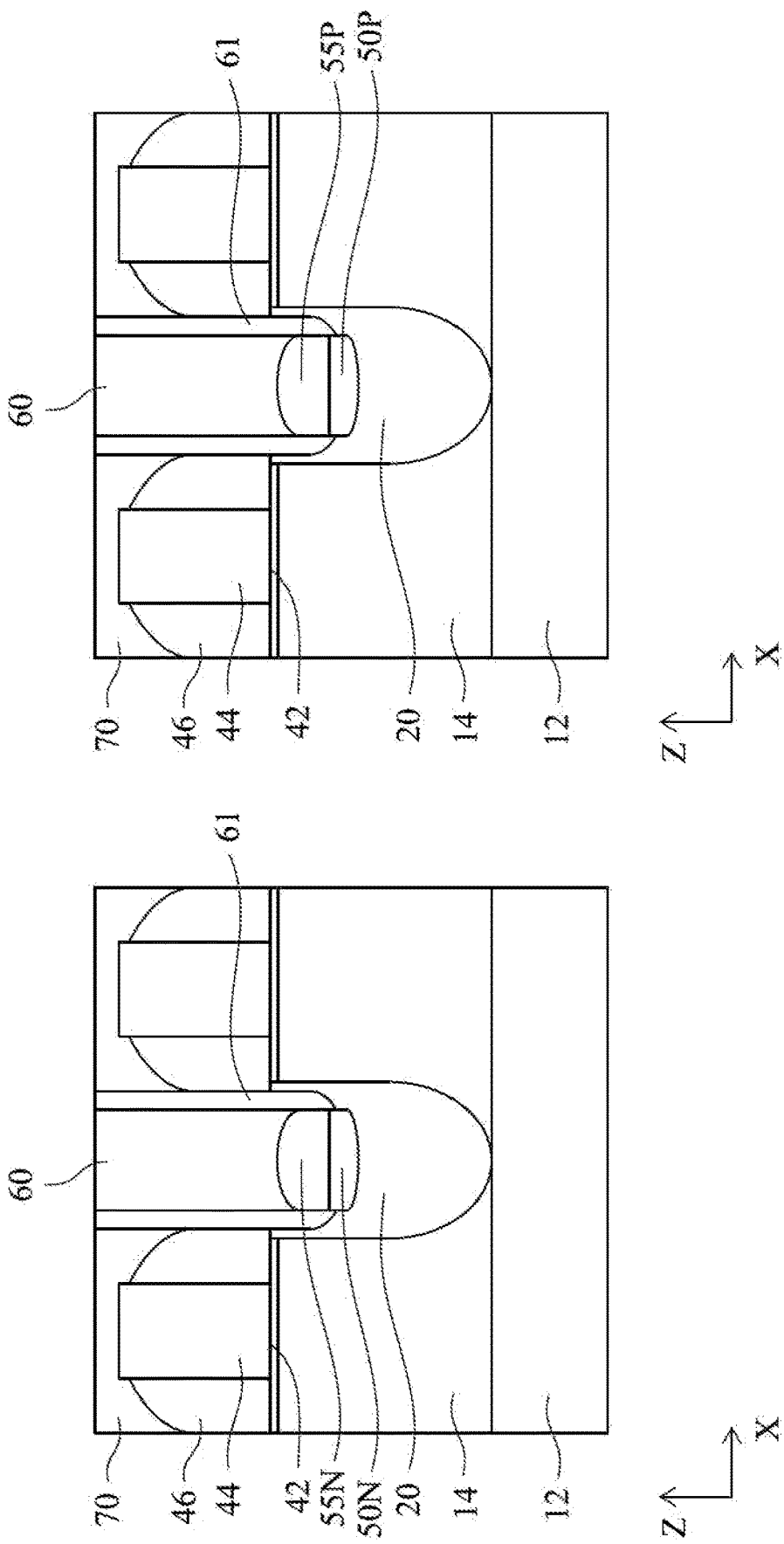
FIGS. 19A and 19B show one of the various stages of a sequential manufacturing operation for a semiconductor device according to embodiments of the present disclosure.

It is understood that the device shown in FIGS. 19A and 19B undergoes further CMOS processes to form various features such as interconnect metal layers, dielectric layers, passivation layers, etc.

Figure 20B:
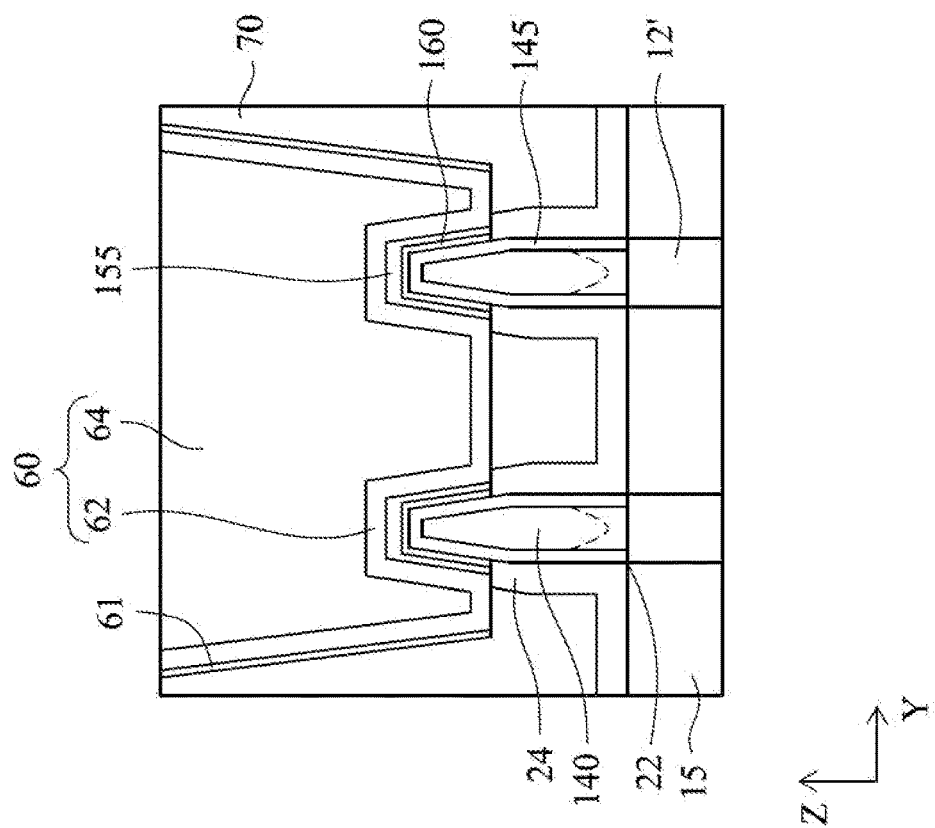
FIG. 20A shows a cross sectional view of a semiconductor device and FIG. 20B is another cross sectional view of the semiconductor device according to other embodiments of the present disclosure.
Figure 20A:
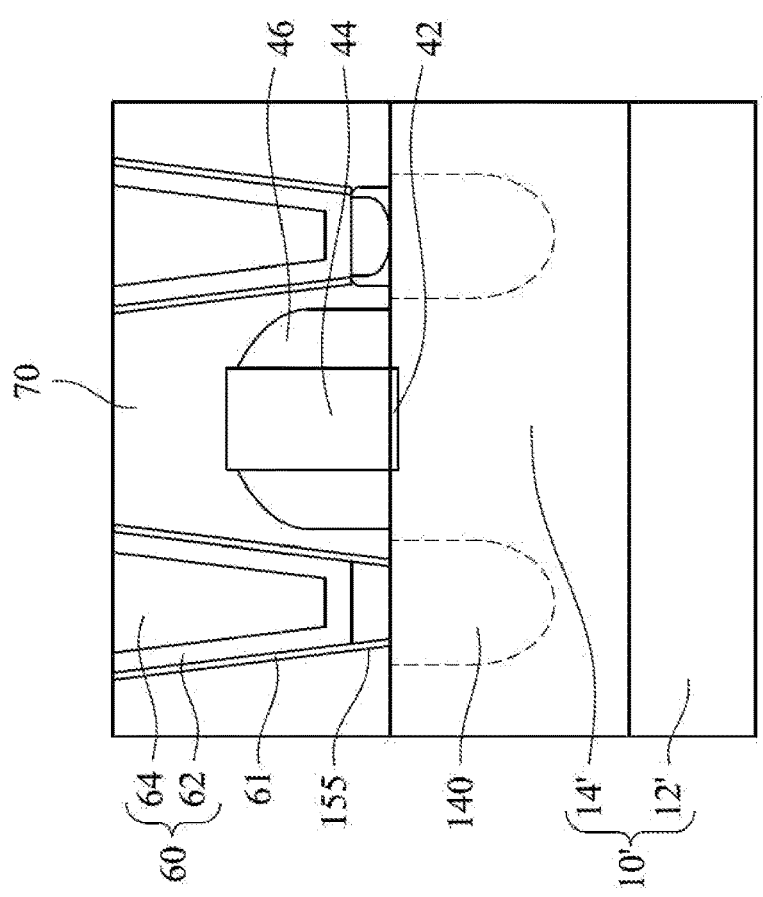

FIG. 20A shows a cross sectional view of a semiconductor device and FIG. 20B is another cross sectional view of the semiconductor device according to other embodiments of the present disclosure. Material, configuration, dimensions and/or processes the same as or similar to the foregoing embodiments described with respect to FIGS. 1A-19B may be employed in the following embodiments, and detailed explanation thereof may be omitted.

In this embodiment, the fin structure 10', at least upper portion of the fin structure 10', is made of SiGe. The SiGe fin structure 10' has a channel region 14' and a well region 12'. In the well region 12', anti-punch-through (APT) implantation is performed, and thus the well region 12' has different dopant concentration/characteristics than the channel region 14'.

The fin structure 10' also has source/drain regions not covered by the gate structure. In the S/D regions, an additional semiconductor layer 145 is conformally formed to cover the S/D regions of the SiGe fin structure 10', thereby forming a lightly doped drain (LDD) structure 145. In addition, in the S/D regions, an ion implantation operation is performed and the S/D regions include heavily doped regions 140.

In the etching operation to form an S/D contact opening, the upper portions of the S/D regions are not etched. Accordingly, the S/D regions protrude from the bottom of the S/D contact opening. After the S/D contact opening is formed, an upper S/D epitaxial layer 160 is formed, and a silicide layer 155 is formed. In some embodiments, the upper S/D epitaxial layer 160 includes SiGe having a higher Ge content than the S/D fin structure. In certain embodiments, the upper S/D epitaxial layer 160 is fully consumed to form the silicide layer 155, and does not exist in the final structure.

The various embodiments or examples described herein offer several advantages over the existing art. For example, by forming an upper S/D epitaxial layer after the S/D contact opening is formed, the contact landing area can be enlarged, thereby reducing S/D contact resistance. Further, it is not necessary to form a large volume lower S/D epitaxial layer first, which can decrease a fin pitch.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, an interlayer dielectric (ILD) layer is formed over an underlying structure. The underlying structure includes a gate structure disposed over a channel region of a fin structure, and a first source/drain epitaxial layer disposed at a source/drain region of the fin structure. A first opening is formed over the first source/drain epitaxial layer by etching a part of the ILD layer and an upper portion of the first source/drain epitaxial layer. A second source/drain epitaxial layer is formed over the etched first source/drain epitaxial layer. A conductive material is formed over the second source/drain epitaxial layer. In one or more of the foregoing or following embodiments, the underlying structure further includes an etch-stop layer, and in the forming the first opening, a part of the etch-stop layer is also is etched. In one or more of the foregoing or following embodiments, after the forming the second source/drain epitaxial layer, a metal layer is formed over the second source/drain epitaxial layer, and a silicide layer is formed by reacting the metal layer and the second source/drain epitaxial layer. The conductive material is formed on the silicide layer. In one or more of the foregoing or following embodiments, before the forming the metal layer, an implantation operation is performed on the second source/drain epitaxial layer. In one or more of the foregoing or following embodiments, after the forming the first opening, a cover layer is formed in the first opening and over the ILD layer, and the cover layer is patterned, thereby forming a second opening in the cover layer. The second source/drain epitaxial layer is formed in the second opening. In one or more of the foregoing or following embodiments, the first source/drain epitaxial layer has a different composition than the second source/drain epitaxial layer. In one or more of the foregoing or following embodiments, the first source/drain epitaxial layer and the second source/drain epitaxial layer contain Ge, and a concentration of Ge in the second source/drain epitaxial layer is higher than a concentration of Ge in the first source/drain epitaxial layer. In one or more of the foregoing or following embodiments, at least one of the first source/drain epitaxial layer and the second source/drain epitaxial layer further contains B. In one or more of the foregoing or following embodiments, the second source/drain epitaxial layer includes one selected from the group consisting of SiP, InP and GaInP. In one or more of the foregoing or following embodiments, the first source/drain epitaxial layer is formed in and above a recess disposed in the fin structure.

According to another aspect of the present disclosure, in a method of manufacturing a semiconductor device, an interlayer dielectric (ILD) layer is formed over an underlying structure. The underlying structure includes a first gate structure and a first source/drain epitaxial layer for a first conductivity-type fin field effect transistor (FinFET), and a second gate structure and a second source/drain epitaxial layer for a second conductivity-type fin field effect transistor (FinFET). A first opening is formed over the first source/drain epitaxial layer by etching a part of the ILD layer and an upper portion of the first source/drain epitaxial layer, and a second opening is formed over the second source/drain epitaxial layer by etching a part of the ILD layer and an upper portion of the second source/drain epitaxial layer. A third source/drain epitaxial layer is formed over the etched first source/drain epitaxial layer, while covering the second opening with a first cover layer. In one or more of the foregoing or following embodiments, the first cover layer is removed and a fourth source/drain epitaxial layer is formed over the etched second source/drain epitaxial layer, while covering the third source/drain epitaxial layer with a second cover layer. In one or more of the foregoing or following embodiments, after the forming the fourth source/drain epitaxial layer, the second cover layer is removed, a metal layer is formed over the third and fourth source/drain epitaxial layers, a first silicide layer is formed by reacting the metal layer and the third source/drain epitaxial layer and forming a second silicide layer by reacting the metal layer and the fourth source/drain epitaxial layer, and a first contact layer is formed on the first silicide layer and a second contact layer on the second silicide layer. In one or more of the foregoing or following embodiments, the first cover layer is also formed in the first opening and over the ILD layer. Further, the first cover layer formed in the first opening is patterned, thereby forming a third opening in the first cover layer, and the third source/drain epitaxial layer is formed in the third opening. In one or more of the foregoing or following embodiments, the second cover layer is also formed in the second opening and over the ILD layer. Further the second cover layer formed in the second opening is patterned, thereby forming a fourth opening in the second cover layer, and the fourth source/drain epitaxial layer is formed in the fourth opening. In one or more of the foregoing or following embodiments, the first source/drain epitaxial layer has a different composition than the third source/drain epitaxial layer, and the second source/drain epitaxial layer has a different composition than the fourth source/drain epitaxial layer. In one or more of the foregoing or following embodiments, the first conductivity-type is p-type, the first source/drain epitaxial layer and the third source/drain epitaxial layer contain Ge, and a concentration of Ge in the third source/drain epitaxial layer is higher than a concentration of Ge in the first source/drain epitaxial layer. In one or more of the foregoing or following embodiments, at least one of the first source/drain epitaxial layer and the third source/drain epitaxial layer further contains B. In one or more of the foregoing or following embodiments, the first conductivity-type is an n-type, and the third source/drain epitaxial layer includes one selected from the group consisting of SiP, InP and GaInP.

In accordance with another aspect of the present disclosure, in a method of manufacturing a semiconductor device, an interlayer dielectric (ILD) layer is formed over an underlying structure. The underlying structure includes a gate structure disposed over a channel region of a first fin structure and a channel region of a second fin structure, a first source/drain epitaxial layer disposed at a source/drain region of the first fin structure, and a second source/drain epitaxial layer disposed at a source/drain region of the second fin structure. A first opening is formed over the first and second source/drain epitaxial layers by etching a part of the ILD layer and upper portions of the first and second source/drain epitaxial layers. A third source/drain epitaxial layer is formed over the etched first and second source/drain epitaxial layers. A conductive material is formed over the third source/drain epitaxial layer.

According to another aspect of the present disclosure, a semiconductor device includes a gate structure disposed over a channel region of a fin structure, a source/drain structure disposed at a source/drain region of the fin structure, an etch-stop layer covering side faces of the source/drain structure, and a conductive contact disposed over the source/drain structure. The source/drain structure includes a first epitaxial layer and a second epitaxial layer disposed over the first epitaxial layer. The second epitaxial layer is disposed on an upper portion of the etch-stop layer. In one or more of the foregoing or following embodiments, the second epitaxial layer is disposed in a recess formed in the first epitaxial layer. In one or more of the foregoing or following embodiments, the semiconductor device further includes a silicide layer disposed between the second epitaxial layer and the conductive contact. In one or more of the foregoing or following embodiments, the silicide layer includes TiSi. In one or more of the foregoing or following embodiments, the first epitaxial layer has a different composition than the second epitaxial layer. In one or more of the foregoing or following embodiments, the first epitaxial layer and the second epitaxial layer contain Ge, and a concentration of Ge in the second epitaxial layer is higher than a concentration of Ge in the first epitaxial layer. In one or more of the foregoing or following embodiments, at least one of the first source/drain epitaxial layer and the second source/drain epitaxial layer further contains B. In one or more of the foregoing or following embodiments, a concentration of B is in a range from $1.0 \times 10^{20}$ cm$^{-3}$ to $6.0 \times 10^{21}$ cm$^{-3}$. In one or more of the foregoing or following embodiments, the first epitaxial layer includes $Si_{1-x}Ge_x$ and the second epitaxial layer includes $Si_{1-y}Ge_y$, and $0.15 \leq x \leq 0.8$, $0.2 \leq y \leq 1.0$ and $x < y$. In one or more of the foregoing or following embodiments, the second epitaxial layer includes one selected from the group consisting of SiP, InP and GaInP. In one or more of the foregoing or following embodiments, a concentration of P in the second epitaxial layer is in a range from $1.0 \times 10^{20}$ cm$^{-3}$ to $6.0 \times 10^{21}$ cm$^{-3}$. In one or more of the foregoing or following embodiments, the first epitaxial layer is formed in a recess disposed in the fin structure.

In accordance with another aspect of the present disclosure, a semiconductor device includes a first fin field effect transistor (FinFET) including a first gate structure disposed over a first channel region of a first fin structure, a first source/drain structure disposed at a first source/drain region of the first fin structure, and a first etch-stop layer covering side faces of the first source/drain structure; and a second FinFET including a second gate structure disposed over a second channel region of a second fin structure, a second source/drain structure disposed at a second source/drain region of the second fin structure, and a second etch-stop layer covering side faces of the second source/drain structure. The first FinFET is first conductivity-type and the second FinFET is second conductive type. The first source/drain structure includes a first lower epitaxial layer and a first upper epitaxial layer disposed over the first lower epitaxial layer. The first upper epitaxial layer is disposed on an upper portion of the first etch-stop layer. In one or more of the foregoing or following embodiments, the semiconductor device further includes a first silicide layer disposed on the first upper epitaxial layer, and a first conductive contact disposed on the first silicide layer. In one or more of the foregoing or following embodiments, the second source/drain structure includes a second lower epitaxial layer and a second upper epitaxial layer disposed over the second lower epitaxial layer, and the second upper epitaxial layer is disposed on an upper portion of the second etch-stop layer. In one or more of the foregoing or following embodiments, the semiconductor device further includes a first silicide layer disposed on the first upper epitaxial layer, and a first conductive contact disposed on the first silicide layer. In one or more of the foregoing or following embodiments, the second upper epitaxial layer includes one selected from the group consisting of SiP, InP and GaInP. In one or more of the foregoing or following embodiments, the first lower epitaxial layer and the first upper epitaxial layer contain Ge, and a concentration of Ge in the first upper epitaxial layer is higher than a concentration of Ge in the first lower epitaxial layer. In one or more of the foregoing or following embodiments, at least one of the first lower epitaxial layer and the first upper epitaxial layer further contains B.

In accordance with another aspect of the present disclosure, a semiconductor device includes a gate structure disposed over a channel region of a first fin structure and a channel region of a second fin structure, a first epitaxial layer disposed at a source/drain region of the first fin structure, a second epitaxial layer disposed at a source/drain region of the second fin structure, a third epitaxial layer, and an etch-stop layer covering side faces of the first and second source/drain epitaxial layers. The third epitaxial layer is disposed on upper portions of the etch-stop layer and on the first and second epitaxial layers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first source/drain epitaxial layer disposed at a source/drain region of a first fin structure;
a second source/drain epitaxial layer disposed at a source/drain region of a second fin structure;
an etch-stop layer covering part of the first and second source/drain epitaxial layers; and
a third source/drain epitaxial layer disposed on the first and second epitaxial layers and disposed on an upper portion of the etch-stop layer disposed between the first source/drain epitaxial layer and the second source/drain epitaxial layer.

2. The semiconductor device of claim 1, wherein the third source/drain epitaxial layer is disposed in recesses formed in the first and second source/drain epitaxial layers.

3. The semiconductor device of claim 1, further comprising a conductive contact disposed on the third source/drain epitaxial layer.

4. The semiconductor device of claim 3, further comprising a silicide layer disposed between the third source/drain epitaxial layer and the conductive contact.

5. The semiconductor device of claim 4, wherein the silicide layer includes titanium silicide.

6. The semiconductor device of claim 1, wherein the third source/drain epitaxial layer has a different composition than the first and second source/drain epitaxial layers.

7. The semiconductor device of claim 6, wherein:
the first, second and third source/drain epitaxial layers contain germanium, and
a concentration of germanium in the third source/drain epitaxial layer is higher than a concentration of germanium in the first and second source/drain epitaxial layers.

8. A semiconductor device, comprising:
a first fin field effect transistor (FinFET) including a first gate structure disposed over first channel regions of two first fin structures, a first source/drain epitaxial layer disposed at a first source/drain region of each of the two first fin structures, and a first etch-stop layer covering part of the first source/drain structure;
a second FinFET including a second gate structure disposed over second channel regions of two second fin structures, a second source/drain epitaxial layer disposed at a second source/drain region of each of the two second fin structures, and a second etch-stop layer covering part of the second source/drain structure, wherein:
the first FinFET further includes a third source/drain epitaxial layer disposed on the first source/drain epitaxial layer of one of the two first fin structures and the first source/drain epitaxial layer of another of the two first fin structures, and disposed on an upper portion of the first etch-stop layer, and
the second FinFET further includes a fourth source/drain epitaxial layer disposed on the second source/drain epitaxial layer of one of the two second fin structures and the second source/drain epitaxial layer of another of the two second fin structures, and disposed on an upper portion of the second etch-stop layer.

9. The semiconductor device of claim 8, wherein the first FinFET is a first conductivity-type and the second FinFET is a second conductive type.

10. The semiconductor device of claim 9, wherein:
the second conductivity type is p-type,
the second and third source/drain epitaxial layers contain germanium, and
a concentration of germanium in the third source/drain epitaxial layer is higher than a concentration of germanium in the second source/drain epitaxial layer.

11. The semiconductor device of claim 10, wherein:
at least one of the second and third source/drain epitaxial layers further contains boron.

12. The semiconductor device of claim 11, wherein a concentration of boron is in a range from $1.0 \times 10^{20}$ cm$^{-3}$ to $6.0 \times 10^{21}$ cm$^{-3}$.

13. The semiconductor device of claim 10, wherein:
the second epitaxial layer includes $Si_{1-x}Ge_x$ and the third epitaxial layer includes $Si_{1-y}Ge_y$, and
$0.15 \leq x \leq 0.8$, $0.2 \leq y \leq 1.0$ and $x < y$.

14. The semiconductor device of claim 9, wherein:
the first conductivity type is n-type, and
the first epitaxial layer includes one selected from the group consisting of SiP, InP and GaInP.

15. The semiconductor device of claim 14, wherein a concentration of phosphorous in the first epitaxial layer is in a range from $1.0 \times 10^{20}$ cm$^{-3}$ to $6.0 \times 10^{21}$ cm$^3$.

16. A semiconductor device, comprising:
a gate structure disposed over a first channel region of a first fin structure and a second channel region of a second fin structure;
a first epitaxial layer disposed at a first source/drain region of the first fin structure;
a second epitaxial layer disposed at a second source/drain region of the second fin structure;
a third epitaxial layer; and
a dielectric layer made of silicon nitride and covering part of the first and second source/drain epitaxial layers, wherein:
a bottom of the third epitaxial layer is disposed on and in direct contact with upper portions of the dielectric layer and on the first and second epitaxial layers.

17. The semiconductor device of claim 16, further comprising a conductive contact disposed on the third epitaxial layer.

18. The semiconductor device of claim 17, further comprising a silicide layer disposed between the third epitaxial layer and the conductive contact.

19. The semiconductor device of claim 18, wherein the conductive contact includes an adhesive layer and a main metal layer made of a different material than the adhesive layer.

20. The semiconductor device of claim 19, wherein the adhesive layer is in contact with the third epitaxial layer.

* * * * *